(12) United States Patent
Hashimoto et al.

(10) Patent No.: US 7,138,646 B2
(45) Date of Patent: Nov. 21, 2006

(54) LIGHT RECEIVING DEVICE WITH CONTROLLABLE SENSITIVITY AND SPATIAL INFORMATION DETECTING APPARATUS WITH CHARGE DISCARDING DEVICE USING THE SAME

(75) Inventors: Yusuke Hashimoto, Neyagawa (JP); Yuji Takada, Kyoto (JP); Fumikazu Kurihara, Nara (JP); Satoshi Furukawa, Hirakata (JP); Motoo Ikari, Kyoto (JP)

(73) Assignee: Matsushita Electric Works, Ltd., Osaka (JP)

( * ) Notice: Subject to any disclaimer, the term of this patent is extended or adjusted under 35 U.S.C. 154(b) by 170 days.

(21) Appl. No.: 10/510,216

(22) PCT Filed: Jul. 14, 2003

(86) PCT No.: PCT/JP03/08934

§ 371 (c)(1),
(2), (4) Date: Oct. 5, 2004

(87) PCT Pub. No.: WO2004/008175

PCT Pub. Date: Jan. 22, 2004

(65) Prior Publication Data

US 2005/0178946 A1 Aug. 18, 2005

(30) Foreign Application Priority Data

Jul. 15, 2002 (JP) .............................. 2002-205165
May 30, 2003 (JP) .............................. 2003-155712

(51) Int. Cl.
*G01N 21/86* (2006.01)
(52) U.S. Cl. ............................ 250/559.38; 250/203.6; 250/208.1
(58) Field of Classification Search ........... 250/559.38, 250/203.6, 208.1, 221
See application file for complete search history.

(56) References Cited

U.S. PATENT DOCUMENTS 5,856,667 A  1/1999 Spirig et al.

(Continued)

FOREIGN PATENT DOCUMENTS

EP  1 152 261 A1  11/2001

(Continued)

OTHER PUBLICATIONS

International Search Report for PCT/JP03/08934 mailed on Dec. 2, 2003.

(Continued)

*Primary Examiner*—Que T. Le
(74) *Attorney, Agent, or Firm*—Rader, Fishman & Grauer PLLC

(57) ABSTRACT

A spatial information detecting apparatus using an intensity-modulated light has a photoelectric converter for receiving a light provided from a space, into which a light intensity-modulated by a predetermined modulation signal is being irradiated, and generating amounts of electric charges corresponding to an intensity of received light; charge discarding portion having an electrode for removing dispensable charges from the electric charges generated by the photoelectric converter according to a voltage applied to the electrode; charge storage portion for storing signal charges from the electric charges generated by the photoelectric converter; control circuit for controlling the voltage applied to the electrode at a timing synchronized with a period of the modulation signal to change a ratio of the signal charges stored in the charge storage portion to the electric charges generated by the photoelectric converter; charge ejector for outputting the signal charges from the charge storage portion; and an analyzer for determining spatial information from an output of the charge ejector. According to this apparatus, since the dispensable charges are previously removed from the electric charges generated by the photoelectric converter by the charge discarding portion, it is possible to improve S/N ratio and accurately determine the spatial information.

16 Claims, 27 Drawing Sheets

U.S. PATENT DOCUMENTS

| | | | |
|---|---|---|---|
| 6,639,656 B1 * | 10/2003 | Takaka et al. | 356/4.01 |
| 6,777,659 B1 | 8/2004 | Schwarte | |
| 6,825,455 B1 | 11/2004 | Schwarte | |
| 2002/0084430 A1 | 7/2002 | Bamji et al. | |
| 2004/0195493 A1 | 10/2004 | Hashimoto et al. | |
| 2005/0145773 A1 | 7/2005 | Hashimoto et al. | |

FOREIGN PATENT DOCUMENTS

| | | |
|---|---|---|
| JP | 10-508736 | 8/1998 |
| JP | 2000-517427 A | 12/2000 |
| JP | 2001-268445 | 9/2001 |
| JP | 2002-516490 | 6/2002 |
| JP | 2004-32682 | 1/2004 |
| JP | 2004-309310 | 11/2004 |
| JP | 3758618 | 1/2006 |
| WO | WO-01/84182 | 11/2001 |
| WO | WO-02/49339 | 6/2002 |

OTHER PUBLICATIONS

Notification of Reasons for Refusal dated Jun. 27, 2006.

Robert Lange, et al. "Demodulation Pixels In CCD and CMOS Technologies For Time-Of-Flight Ranging", In Sensors and Camera Systems for Scientific, Industrial, and Digital Photography Applications, Morley M. Blouke, et al., Editors, Proceedings of SPIE vol. 3965; pp. 177-188 (May 2000).

* cited by examiner

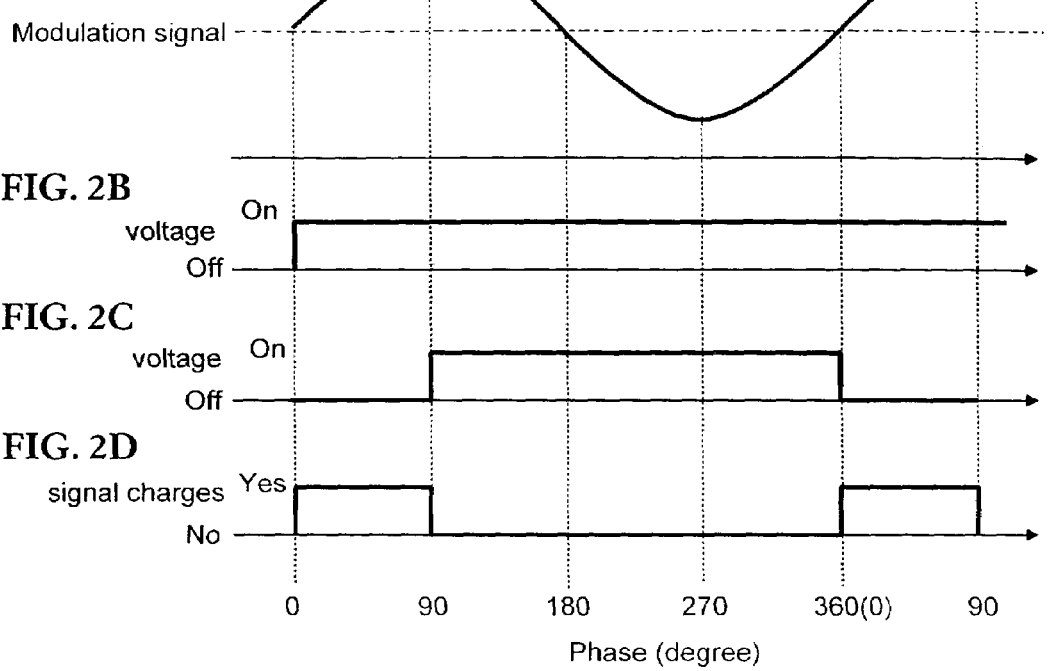
FIG. 2A Modulation signal
FIG. 2B voltage
FIG. 2C voltage
FIG. 2D signal charges
Phase (degree)
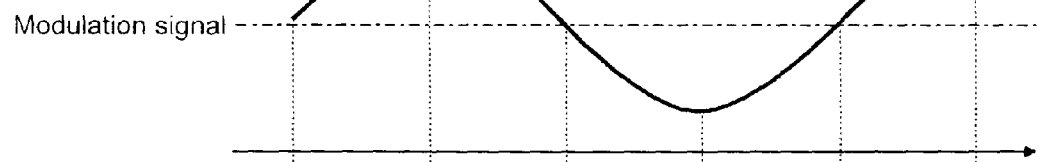
FIG. 3A Modulation signal
FIG. 3B voltage
FIG. 3C voltage
FIG. 3D signal charges
Phase (degree)

Modulation signal voltage voltage signal charges

Phase (degree)

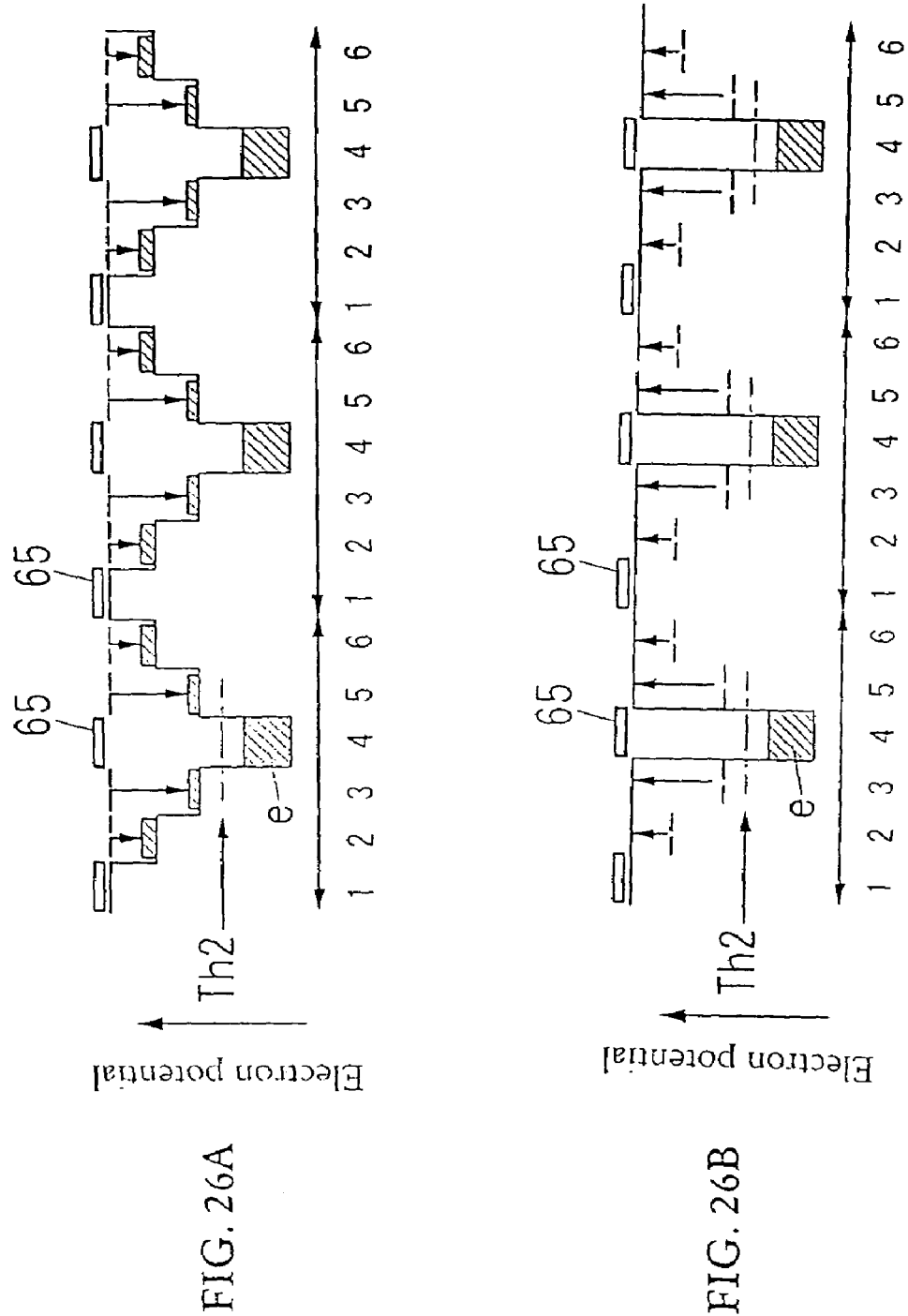

LIGHT RECEIVING DEVICE WITH CONTROLLABLE SENSITIVITY AND SPATIAL INFORMATION DETECTING APPARATUS WITH CHARGE DISCARDING DEVICE USING THE SAME

TECHNICAL FIELD

The present invention relates to a light receiving device using a new sensitivity control method and a spatial information detecting apparatus according to the technical concept of the same light receiving device.

BACKGROUND ART

In the past, a technique of detecting spatial information by use of an intensity-modulated light has been utilized. That is, the intensity-modulated light is irradiated from a light source into a space, and a light reflected from an object in the space is received by a photoelectric converter. The spatial information can be determined from a relationship between the intensity-modulated light and the received light. In the present description, the spatial information includes a distance from the object, a change in light receiving amount caused by reflections on the object, and so on. For example, the distance information can be determined from a phase difference between the intensity-modulated light and the received light. In general, this technique is called as "Time-of-Flight (TOF)" method.

For example, U.S. Pat. No. 5,856,667 discloses a distance measuring apparatus using the TOF method. In this apparatus, a light emitted from a light source is intensity-modulated by a sine wave having a required modulation frequency (i.e., emission frequency), and a light sensitive part detects an intensity of received light plural times within a time period shorter than a modulation period that is a reciprocal of the modulation frequency. When detecting the intensity of received light is repeated 4 times within one modulation period, the phase difference is determined from the detected four intensities of received light. For example, when intensity-modulating the light irradiated from the light source to an object by a radio frequency wave of 20 MHz, a wavelength of the intensity-modulated light is 15 m. Therefore, when the intensity-modulated light goes to the object spaced from the apparatus by a distance of 7.5 m and back, a phase delay corresponding to one modulation period occurs.

When the light emitted from the light source is intensity-modulated, as shown by the curve "W" of FIG. 30, and the modulated light reflected from an object is received by the light sensitive part, the intensity of received light changes, for example, as shown by the curve "R" of FIG. 30. In this case, four intensities (A0, A1, A2, A3) of received light can be detected at 4 different phases (0°, 90°, 180°, 270°). However, in the present circumstances, it is impossible to detect the intensity of light received at just the moment of each of the phases (0°, 90°, 180°, 270°). In the fact, each of the intensities of received light corresponds to the intensity of light received within a time width (Tw), as shown in FIG. 30.

On the assumption that the phase difference "$\psi$" does not change within the time period of sampling the intensity (A0, A1, A2, A3) of received light, and there is no change in light extinction ratio between the emitted light and the received light, a relationship between the intensity (A0, A1, A2, A3) of received light and the phase difference "$\psi$" can be represented by the following equation:

$$\psi = \tan^{-1}\{(A3-A1)/(A0-A2)\}.$$

By use of the thus obtained phase difference "$\psi$" [rad], the modulation period "T" [s], and the speed of light "c" [m/s], a distance "L" [m] between the object and the apparatus can be calculated by the following equation:

$$L \approx cT(\psi/4\pi).$$

To achieve the technical concept described above, this US patent proposes to use an image sensor shown in FIG. 31, which comprises four memory cells (M0, M1, M2, M3) provided every light sensitive part (PD), and an electrical switch (S0, S1, S2, S3) disposed between each of the memory cells and the light sensitive part. The electrical switches (S0, S1, S2, S3) are respectively turned on within the short time width (Tw), as shown in FIG. 30, to store the intensities (A0, A1, A2, A3) of received light in the memory cells (M0, M1, M2, M3). By repeating this procedure with respect to a plurality of periods, it is possible to reduce influences of dark current noises, shot noises (i.e., noises caused by variations in the occurrence of electron-hole pairs), static noises of an amplifier circuit, and so on, and improve S/N ratio. In the present specification, the operation described above is called as "synchronized integration".

However, when electric charges are generated by the light sensitive part, parts of them may remain in the light sensitive part for a moment without being transferred to the memory cell through the electric switch. Such residual electric charges disappear by recombinations in the light sensitive part. Alternatively, when another electrical switch is turned on within the time width (Tw), the residual electric charges may be accidentally transferred to another memory cell through to the electric switch.

For example, when the modulation frequency is 20 MHz, it is needed that the time width (Tw) is shorter than the modulation period of 50 ns. On the other hand, time required for allowing the residual electric charges to disappear by the recombinations is usually longer than 100 µs. Therefore there is a possibility that the residual electric charges are accidentally transferred to another memory cell. This means that the residual electric charges are mixed as noise components in signal charges to be stored in the memory cell. As a result, when determining the phase difference "$\psi$" according to the above-described operation, there is a problem of lowering the accuracy of detecting the distance information. In addition, when using the image sensor with a large number of electrical switches, as shown in FIG. 31, there is another problem deteriorating cost/performance of the distance measuring apparatus.

SUMMARY OF THE INVENTION

Therefore, a primary concern of the present invention is to provide a spatial information detecting apparatus using an intensity-modulated light, which has the capability of preventing dispensable electric charges being mixed as noise components in signal charges used to determine the spatial information, and improving S/N ratio.

That is, the spatial information detecting apparatus of the present invention comprises:

at least one photoelectric converter for receiving a light provided from a space, into which the light intensity-modulated by a predetermined modulation signal is being irradiated, and generating amounts of electric charges corresponding to an intensity of received light;

a charge discarding portion having a first electrode for removing dispensable charges from the electric charges generated by the photoelectric converter according to a voltage applied to the first electrode;

a charge storage portion for storing signal charges from the electric charges generated by the photoelectric converter;

a control circuit for controlling the voltage applied to the first electrode at a timing synchronized with a period of the modulation signal to change a ratio of the signal charges stored in the charge storage portion to the electric charges generated by the photoelectric converter;

a charge ejector for outputting the signal charges from the charge storage portion; and an analyzer for determining spatial information from an output of the charge ejector.

According to the present invention, since the voltage applied to the first electrode of the charge discarding portion is controlled at the timing-synchronized with the period of the modulation signal, there is an advantage that residual electric charges, which are not used as the signal charges, i.e., parts of the electric charge generated by the photoelectric converter can be surely removed as the dispensable charges before they are transferred to the charge storage portion, and as a result the S/N ratio is remarkably improved. In addition, since the signal charges can be transferred the charge storage portion without the lapse of time needed for allowing the residual electric charges to disappear by recombinations in the photoelectric converter, it is possible to efficiently determine the spatial information with high accuracy.

In the present invention, it is preferred that the charge storage portion has a second electrode, and the control circuit controls a voltage applied to the second electrode constant to transfer required amounts of the electric charges generated by the photoelectric converter to the charge storage portion. Moreover, it is preferred that the control circuit controls the voltages applied to the first and second electrodes so as to alternately switch between a stage of transferring the electric charges generated by the photoelectric converter to the charge storage portion and a stage of transferring the electric charges generated by the photoelectric converter to the charge discarding portion.

In addition, it is preferred that the analyzer determines distance information from the signal charges stored with respect to different phases in a period of the modulation signal, and the spatial information detecting apparatus further comprises a phase switch for changing the phase of the modulation signal, at which the voltage is applied to the first electrode, every time that storing the signal charges in the charge storage portion at the phase is finished. It is further preferred that the charge storage portion has a light shielding film on the first electrode formed in the vicinity of a region of storing the signal charges.

A further concern of the present invention is to provide another spatial information detecting apparatus using an intensity-modulated light, which has the capability of achieving the above-described advantages.

That is, the spatial information detecting apparatus of the present invention comprises:

at least one photoelectric converter for receiving a light provided from a space, into which a light intensity-modulated by a predetermined modulation signal is being irradiated, and generating amounts of electric charges corresponding to an intensity of received light;

a charge discarding portion having a first electrode for removing dispensable charges from the electric charges generated by the photoelectric converter according to a voltage applied to the first electrode;

a charge storage portion having a second electrode for storing signal charges from the electric charges generated by the photoelectric converter according to a voltage applied to the second electrode;

a control circuit for controlling the voltage applied to the second electrode at a timing synchronized with a period of the modulation signal, while applying a constant voltage to the first electrode, to change a ratio of the signal charges stored in the charge storage portion to the electric charges generated by the photoelectric converter;

a charge ejector for outputting the signal charges from the charge storage portion; and an analyzer for determining spatial information from an output of the charge ejector.

According to the present invention, the ratio of the signal charges to be stored in the charge storage portion to the electric charges generated by the photoelectric converter can be changed by controlling the voltage applied to the second electrode at the timing synchronized with the period of the modulation signal, and parts (i.e., residual electric charges) of the electric charges generated by the photoelectric converter are always discarded as the dispensable charges by applying the constant voltage to the first electrode. That is, it is possible to control amounts of the signal charges to be transferred to the charge storage portion from the electric charges generated by the photoelectric converter, while removing the dispensable charges from the electric charges generated by the photoelectric converter. Therefore, there is an advantage of more efficiently determining the spatial information without deteriorating the detection accuracy.

As a further preferred embodiment of the present invention, the spatial information detecting apparatus comprises a plurality of photoelectric converters, and a set of photoelectric converters is selected from the plurality of photoelectric converters to define one pixel. The control circuit allows the charge storage portion to store the signal charges from the electric charges generated by each of the photoelectric converters of the set at a timing of each of different phases in synchronization with the period of the modulation signal. The charge ejector simultaneously outputs the signal charges stored with respect to the different phases.

Another concern of the present invention is to provide a spatial information detecting method using a conventional CCD image sensor having an overflow drain electrode, which is characterized by controlling a control voltage applied to the overflow electrode in synchronization with the period of the modulation signal to achieve a substantially same operation as the synchronized integration.

That is, the spatial information detecting method comprises the steps of:

allowing the CCD image sensor to receive a light provided from a space, into which a light intensity-modulated by a predetermined modulation signal is being irradiated;

storing signal charges by repeating a charge extraction operation plural times with respect to each of different phases in a period of the modulation signal; and determining spatial information from the signal charges stored with respect to the different phases of the modulation signal, wherein the charge extraction operation includes the steps of removing dispensable charges from electric charges generated by photoelectric converters of the CCD image sensor according to a control voltage applied to the overflow electrode in synchronization with the period of the modulation signal, and storing the balance of the electric charges as the signal charges in a charge storage area of the CCD image sensor.

According to the above method of the present invention, even when the conventional CCD image sensor is used to detect the spatial information, it is possible to improve S/N ratio and efficiently obtain the spatial information with high accuracy by controlling the control voltage applied to the overflow electrode in synchronization with the period of the modulation signal in place of using a large number of electrical switches.

In the detecting method described above, it is preferred that the CCD image sensor has at least three photoelectric converters, and the charge extraction operation includes the step of applying the control voltage to the overflow drain electrode in synchronization with the period of the modulation signal such that the electric charges generated by a predetermined one(s) of the at least three photoelectric converters are stored as the signal charges in the charge storage area, and the electric charges generated by the remaining photoelectric converter(s) are discarded as the dispensable charges. It is also preferred that the control voltage is applied to the overflow drain electrode to generate a potential barrier for electrically isolating the predetermined photoelectric converter(s) from the remaining photoelectric converter(s).

Still another concern of the present invention is to provide a light receiving device with controllable sensitivity, which is particularly useful for the spatial information detecting apparatus described above.

That is, the light receiving device of the present invention comprises:

at least one photoelectric converter for receiving a light provided from a space, into which a light intensity-modulated by a predetermined modulation signal is being irradiated, and generating amounts of electric charges corresponding to an intensity of received light;

a charge discarding portion having an electrode for removing dispensable charges from the electric charges generated by the photoelectric converter according to a voltage applied to the electrode;

a charge storage portion for storing signal charges from the electric charges generated by the photoelectric converter;

a sensitivity controller for controlling the voltage applied to the electrode at a timing synchronized with a period of the modulation signal to change a ratio of the signal charges stored in the charge storage portion to the electric charges generated by the photoelectric converter; and a charge ejector for outputting the signal charges from the charge storage portion.

These and still other objects and advantages of the present invention will become more apparent from the best mode for carrying out the invention explained below, referring to the attached drawings.

BRIEF EXPLANATION OF THE DRAWINGS

FIGS. 2A to 2D are explanatory diagrams illustrating the principle of operation of the distance measuring apparatus according to a first embodiment of the present invention;

FIGS. 3A to 3D are explanatory diagrams illustrating the principle of operation of the distance measuring apparatus according to a second embodiment of the present invention;

FIGS. 26A and 26B are potential diagrams illustrating operations of a distance measuring apparatus according to a tenth embodiment of the invention;

BEST MODE FOR CARRYING OUT THE INVENTION

As an example of a spatial information detecting apparatus of the present invention, preferred embodiments of a distance measuring apparatus for determining distance information from a phase difference between an intensity-modulated light irradiated to an object and a light received by photoelectric converter are explained in detail below. However, needless to say, the present invention is not limited to those embodiments. It should be interpreted that the technical idea of the present invention is available to any apparatus or devices using the phase difference.

<First Embodiment>

Figure 1:
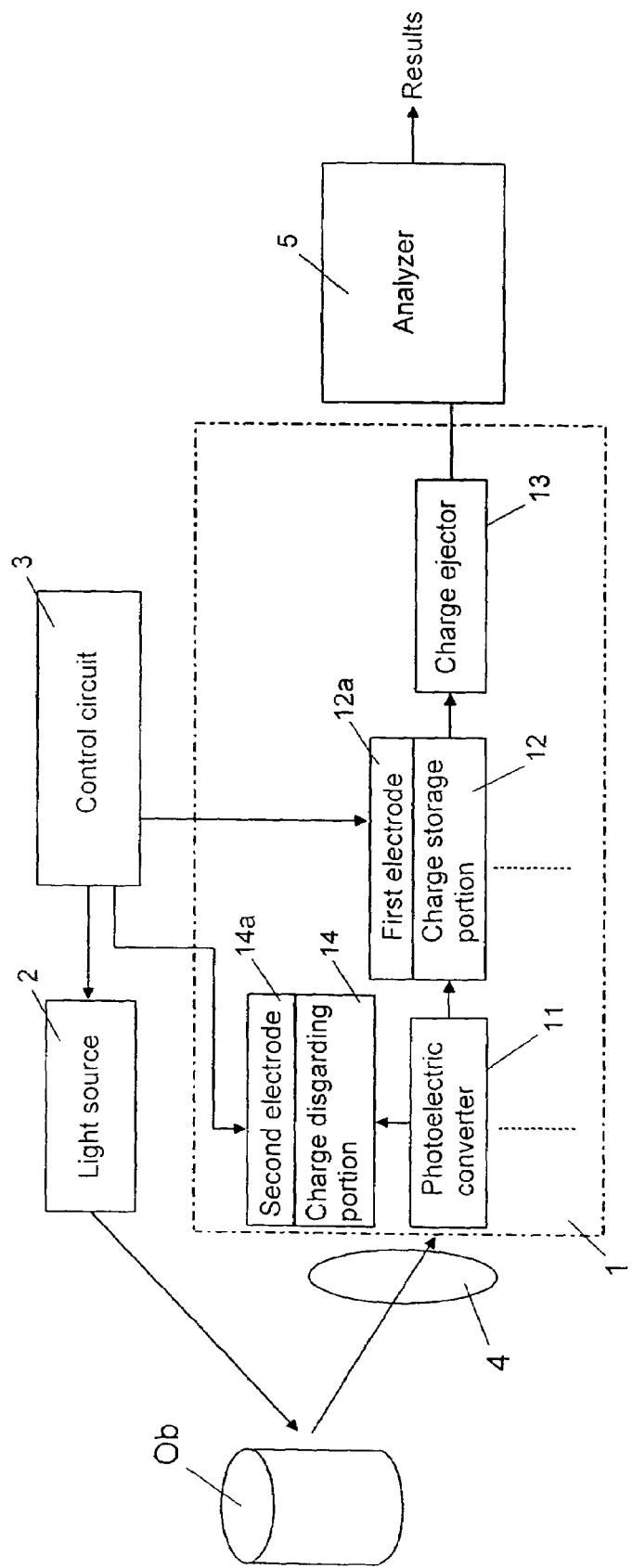
FIG. 1 is a block diagram of a distance measuring apparatus of the present invention.

As shown in FIG. 1, the distance measuring apparatus of the present embodiment has a light source 2 for emitting a light into a required space. The light emitted from the light source 2 is intensity-modulated at a predetermined modulation frequency by a control circuit 3. As the light source 2, for example, it is possible to use an array of light emitting diodes (LED) or a combination of semiconductor laser and divergent lens. As an example, the control circuit 3 intensity-modulates the light emitted from the light source 2 by a sine wave of 20 MHz.

In addition, the distance measuring apparatus has a plurality of photoelectric converters 11 for receiving a light provided from the space through an optical system such as lens 4. Each of the photoelectric converters 11 generates amounts of electric charges corresponding to an intensity of received light. For example, a photodiode can be used as the photoelectric converter 11. As a structure of the photodiode, there are "p-n" junction structure, "pin" structure and "MIS" structure. In this embodiment, a matrix array of 100×100 photoelectric converters 11 is used as an image sensor 1.

3-dimensional information of the space, into which the light of the light source 2 is being irradiated, is mapped on a 2-dimensional planar surface that is a light receiving surface of the image sensor 1 through the lens 4. For example, when an object "Ob" exists in the space, a light reflected from each point of the object is received by a photoelectric converter. By detecting a phase difference between the light emitted from the light source 2 and the light received by the photoelectric converter 11, a distance between the apparatus and each point of the object can be determined.

In addition to the photoelectric converter 11, the image sensor 1 has a charge storage portion 12 for storing parts of electric charges generated by the photoelectric converter 11 as signal charges used to determine the phase difference, charge discarding portion 14 for removing dispensable charges that are not used as the signal charges from the electric charges generated by the photoelectric converter, and a charge ejector 13 for outputting the signal charges from the charge storage portion 12 to the outside of the image sensor 1. The charge storage portion 12 has a first electrode 12a. Amounts of electric charges transferred from the photoelectric converter 11 to the charge storage portion 12 can be changed by controlling a voltage applied to the first electrode 12a. In addition, the charge discarding portion 14 has a second electrode 14a. Amounts of electric charges transferred from the photoelectric converter 11 to the charge discarding portion 14 can be changed by controlling a voltage applied to the second electrode 14a.

The charge storage portion 12 is provided every photoelectric converter 11. Therefore, the number of the charge storage charge portions 12 is equal to the number of the photoelectric converters 11. On the other hand, the charge discarding portion 14 may be provided every set of a plurality of photoelectric converters 11. In this embodiment, a single charge discarding portion 14 is formed for all of the photoelectric converters 11 of the image sensor 1. The signal charges output from the charge ejector 13 are sent to an analyzer 5. In the analyzer 5, the phase difference between the light irradiated from the light source 2 and the light received by the photoelectric converter 11 is determined, and a distance between the apparatus and the object can be determined according to the phase difference.

Figure 30:
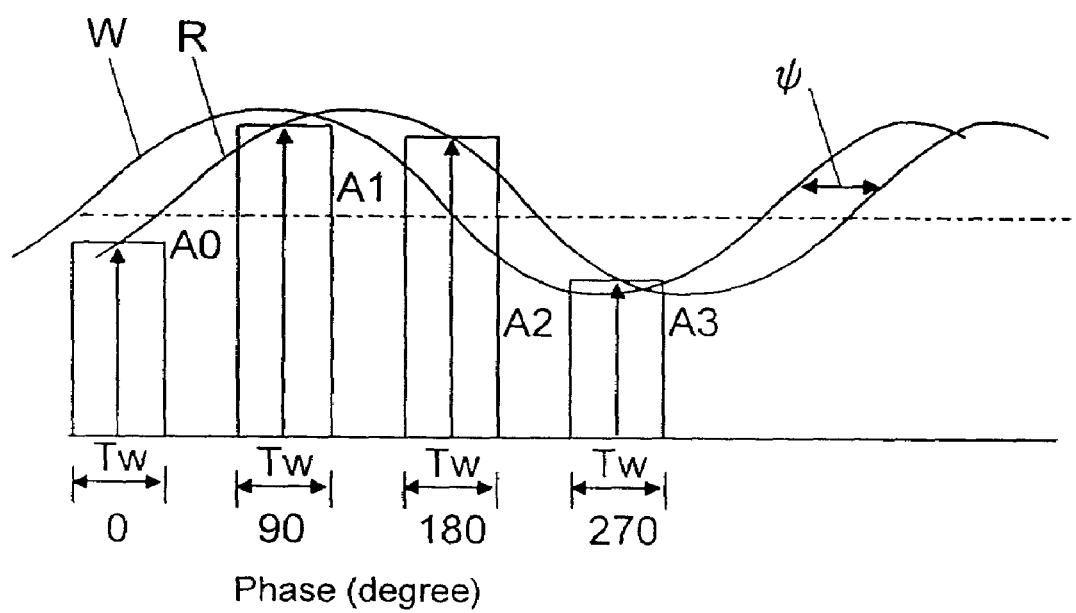
FIG. 30 is an explanatory diagram illustrating the principle of operation of a conventional distance measuring apparatus.
Figure 31:
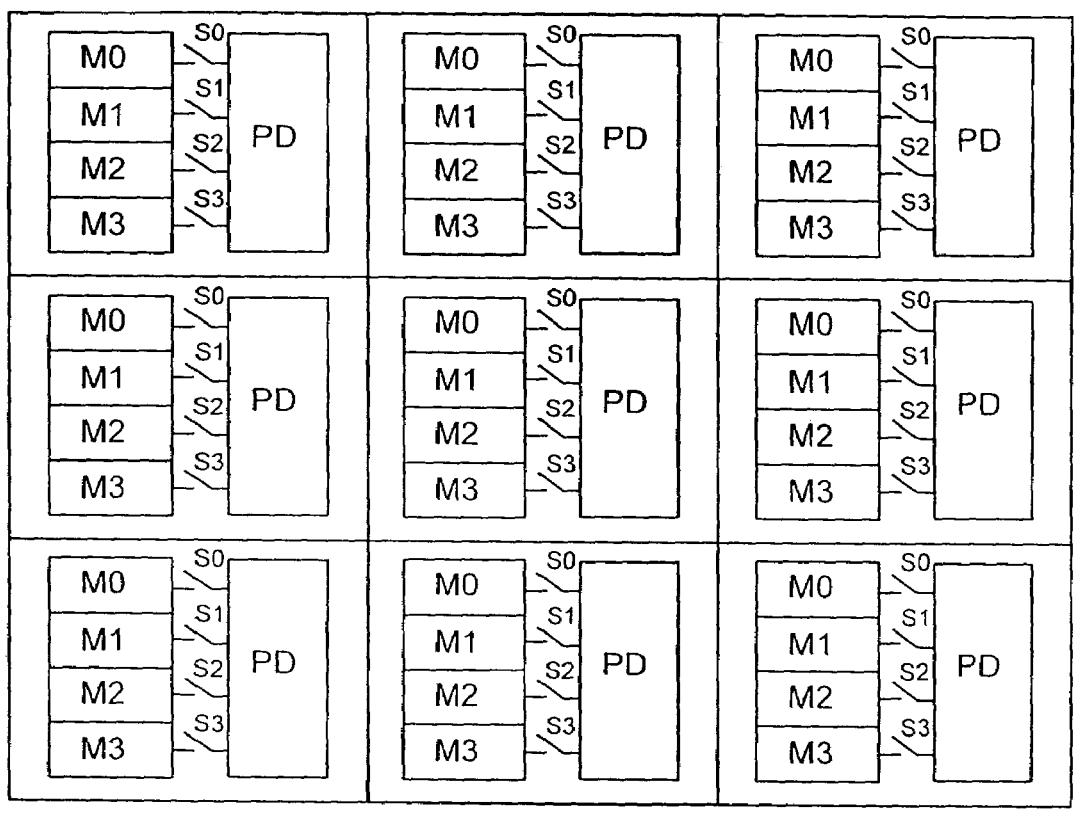
FIG. 31 is a plan view of an image sensor used in the conventional distance measuring apparatus.

As explained above, to determine the distance from the object "Ob", it is required to detect the intensity (A0, A1, A2, A3) of received light at the timing synchronized with a period of the modulation signal. Electric charges generated by the photoelectric converter 11 within a constant time width "Tw" (FIG. 30) at a specific phase (e.g., 0°, 90°, 180°, 270°) of the modulation signal are stored as the signal charges in the charge storage portion 12. Therefore, it is preferred to increase amounts of electric charges generated within the time width "Tw", and on the contrary decrease the amounts of electric charges generated in the remaining time periods other than the time width (Tw), and ideally reduce the amounts of electric charges generated in the remaining time periods to zero. Since the amounts of electric charges generated by the photoelectric converter 11 changes in accordance with an amount of light incident on the photoelectric converter 11, it is required to control sensitivity of the image sensor 1 to obtain increased amounts of signal charges.

To control the sensitivity of the image sensor 1, it can be proposed to control a magnitude of the voltage applied to the first electrode 12a of the charge storage portion 12 at an adequate timing. However, since parts of the electric charges generated by the photoelectric converter 11, i.e., residual electric charges that are not used as the signal charges, may be mixed as noise components in the signal charges, it is not sufficient to control the magnitude of the voltage applied to the first electrode.

In the present embodiment, required amounts of electric charges generated by each of the photoelectric converters 11 are always supplied to the corresponding charge storage portion 12 by keeping the magnitude of the voltage applied to the first electrode 12a constant. On the other hand, a required voltage is applied to the second electrode 14a of the charge discarding portion 14 except for a signal charge generation period, in which the electric charges used as the signal charges are generated by the photoelectric converter 11, so that the electric charges generated in the time period other than the signal charge generation period by the photoelectric converter 11 are sent as dispensable charges to the charge discarding portion 14. In short, the sensitivity of the image sensor 1 can be controlled by changing the voltage applied to the second electrode 14a at the timing synchronized with the period of the modulation signal.

The basic concept of the present invention is explained in more detail referring to FIGS. 2A to 2D. In this explanation, the light irradiated from the light source 2 to the space is intensity-modulated by a modulation signal shown in FIG. 2A. For example, electric charges corresponding to an intensity (e.g., "A0" of FIG. 30) of received light are generated by the photoelectric converter 11 in a specific phase range (0 to 90 degrees) corresponding to the time width "Tw" of FIG. 30 within one period of the modulation signal, and stored in the charge storage portion 12. This procedure is repeated plural times, e.g., several ten thousands of times~several hundreds of thousand of times (i.e., several ten thousands of periods~several hundreds of thousand of periods of the modulation signal) to accumulate signal charges corresponding to the intensity "A0" of received light.

In this case, as shown in FIG. 2B, the voltage applied to the first electrode 12a of the charge storage portion 12 is maintained constant. On the other hand, as shown in FIG. 2C, a required voltage is applied to the second electrode 14a of the charge discarding portion 14 for the time period (corresponding to the phase range of 90 to 360 degrees) other than the signal charge generation period, so that the electric charges generated by the photoelectric converter during the time period are discarded as dispensable charges. In other words, since the voltage is not applied to the second electrode 14a for the signal charge generation period (corresponding to the phase range of 0 to 90 degrees), the electric charges generated by the photoelectric converter 11 during the signal charge generation period is supplied as the signal charges to the charge storage portion 12.

In this control method, therefore, the stage (FIG. 2B) of applying the voltage to the first electrode 12a of the charge storage portion 12 is partially overlapped with the stage (FIG. 2C) of applying the voltage to the second electrode 14a of the charge discarding portion 14. According to this voltage control, it is possible to extract the signal charges corresponding to the intensity "A0" of received light, as shown in FIG. 2D. In this embodiment, data sampling is performed every quarter of period of the modulation signal.

The above signal extracting treatment shown in FIGS. 2A to 2D are repeated several ten thousands of times~several hundreds of thousand of times to obtain accumulated signal charges corresponding to the intensity "A0" of received light, and then the accumulated signal charges are output to the analyzer 5 through the charge ejector 13. Similarly, the above procedures are performed to store the accumulated signal charges corresponding to each of the intensities (A0, A1, A2, A3) of received light in the charge storage portion 12.

Thus, since the image sensor 1 of the present embodiment has the charge discarding portion 14 with the second electrode 14a, and parts of the electric charges generated by the photoelectric converter 11 that are not used as the signal charges are aggressively removed as the dispensable charges by controlling the voltage applied to the second electrode 14a, it is possible to effectively prevent the dispensable charges being mixed as noise components into the signal charges. In addition, since the signal charges are accumulated over several ten thousands of periods to several hundred of thousands of periods of the modulation signal, it is possible to precisely determine the distance information. From the viewpoint of high sensitivity, for example, when the modulation signal is set to 20 MHz, and the signal charges are extracted at 30 frames per second, it is possible to accumulate the signal charges over several hundred of thousands of periods of the modulation signal.

In the above explanation, the constant voltage is applied to the first electrode 12a during the time period of applying the voltage to the second electrode 14a. However, by adequately setting a magnitude relation between the voltages applied to the first and second electrodes, it is possible to prevent the signal charges being stored during the stage of removing the electric charges as the dispensable charges.

As a modification of this embodiment, a set of the charge storage portion 12 and the charge discarding portion 14 may be formed every photoelectric converter 11. In this case, it is possible to obtain the electric charges corresponding to four intensities (A0, A1, A2, A3) of received light at a time within one period of the modulation signal. As to the timing of data sampling, when phase intervals are predetermined, it is not required to adopt equally spaced phase intervals.

In the present embodiment, the light emitted from the light source 2 is intensity-modulated by the sine wave. However, the intensity modulation may be performed by use of another waveform such as a triangular wave or a sawtooth wave. In addition, as the light emitted from the light source 2, infrared light or the like may be used other than the visible light. In place of the image sensor 1 having the matrix arrangement of the photoelectric converters 11, another image sensor having a one dimensional arrangement of the photoelectric converters 11 may be used. In addition, when measuring the distance information in only one direction in the space, or scanning the light beam irradiated from the light source 2 to the space, it is possible to adopt the image sensor using only four photoelectric converters to determine the distance information. In this embodiment, the photoelectric converters 11 are integrally formed with the charge storage portions 12. However, functions of the image sensor 1 may be achieved by use of separated parts.

<Second Embodiment>

This embodiment presents another sensitivity controlling method for the image sensor of the distance measuring apparatus shown in FIG. 1. That is, as shown in FIGS. 3A to 3D, the control method is characterized in that a stage (FIG. 3B) of applying a voltage to the first electrode 12a of the charge storage portion 12 is not overlapped with the stage (FIG. 3C) of applying a voltage to the second electrode 14a of the charge discarding portion 14.

For example, the light irradiated from the light source 2 to the space is intensity-modulated by a modulation signal shown in FIG. 3A. FIGS. 3B to 3C explain the case of detecting electric charges corresponding to the intensity (e.g., "A0" of FIG. 3O) of received light, which are generated by the photoelectric converter in a specific phase range (0 to 90 degrees) corresponding to the time width "Tw" of FIG. 3O within one period of the modulation signal. As shown in FIG. 3B, the voltage is applied to the first electrode 12a every quarter of period of the modulation signal, i.e., in a specific phase range (0 to 90 degrees) within each period of the modulation signal to send the electric charges generated by the photoelectric converter 11 as the signal charges to the charge storage portion 12.

On the other hand, as shown in FIG. 3C, the voltage is applied to the second electrode 14a in the remaining phase range (90 to 360 degrees) other than the specific phase range (0 to 90 degrees), in which the voltage is applied to the first electrode 12a, to send the electric charges generated by the photoelectric converter 11 as the dispensable charges to the charge discarding portion 14. According to the voltage control described above, it is possible to extract the signal charges corresponding to the intensity "A0" of received light, as shown in FIG. 3D.

According to this embodiment, it is possible to separately control the voltages applied to the first and second electrodes without considering the magnitude relation between those voltages, and therefore there is an advantage that it becomes easy to control these voltages. As a result, it is possible to easily control the sensitivity that is a ratio of the signal charges relative to the electric charges generated by the photoelectric converter 11, and the ratio of the dispensable charges relative to the electric charges generated by the photoelectric converter 11.

In this embodiment, since the stage of storing the signal charges in the charge storage portion 12 is determined by the voltage applied to the first electrode 12a, it is possible to shorten the stage of applying the voltage to the second electrode 14a. For example, the voltage may be applied to the second electrode 14a for a required time period immediately before the voltage is applied to the first electrode 12a. Other configuration and operation are substantially the same as the first embodiment.

<Third Embodiment>

This embodiment presents another sensitivity controlling method for the image sensor 1 of the distance measuring apparatus shown in FIG. 1. That is, as shown in FIGS. 4A to 4D, the control method is characterized in that a constant voltage is always applied to the second electrode 14a of a charge discarding portion 14 to discard parts of the electric charges generated by the photoelectric converter 11 as dispensable charges, and the electric charges generated by the photoelectric converter 11 are stored as signal charges in the charge storage portion 12 in only a stage of applying a voltage to a first electrode 12a of the charge storage portion 12.

Figure 4A:
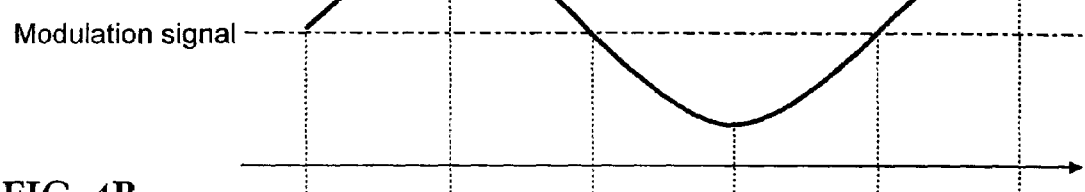
FIGS. 4A to 4D are explanatory diagrams illustrating the principle of operation of the distance measuring apparatus according to a third embodiment of the present invention.
Figure 4B:
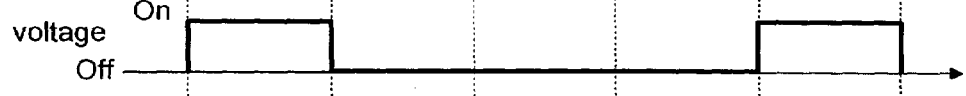
Figure 4C:
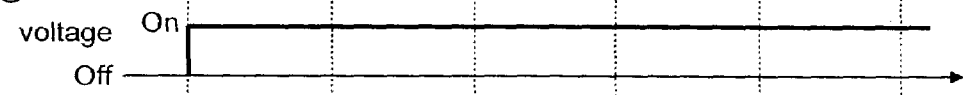

For example, the light irradiated from the light source 2 to the space is intensity-modulated by a modulation signal shown in FIG. 4A. FIGS. 4B to 4C explain the case of detecting electric charges corresponding to the intensity (e.g., "A0" of FIG. 30) of received light, which are generated by the photoelectric converter in a specific phase range (0 to 90 degrees) corresponding to the time width "Tw" of FIG. 30 within one period of the modulation signal. As shown in FIG. 4B, the voltage is applied to the first electrode 12a every quarter of period of the modulation signal, i.e., in a specific phase range (0 to 90 degrees) within each period of the modulation signal to send the electric charges generated by the photoelectric converter 11 as the signal charges to the charge storage portion 12.

Figure 4D:
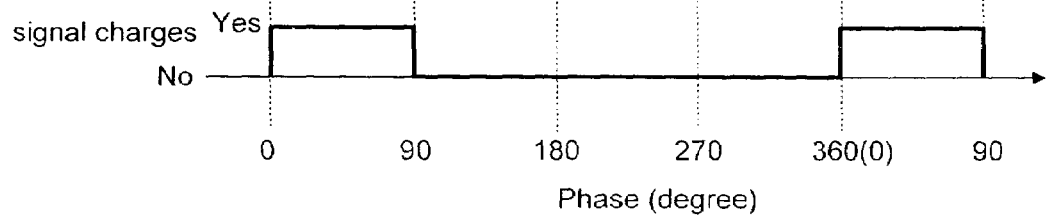

On the other hand, as shown in FIG. 4C, a constant DC voltage is always applied to the second electrode 14a to send parts of the electric charges generated by the photoelectric converter 11 as the dispensable charges to the charge discarding portion 14. However, as described above, since the electric charges generated by the photoelectric converter 11 in the stage of applying the voltage to the first electrode 12a are sent as the signal charges to the charge storage portion 12, it is possible to extract the signal charges corresponding to the intensity "A0" of received light, as shown in FIG. 4D.

According to this embodiment, irrespective of the presence or absence of the voltage applied to the first electrode 12a, predetermined amounts of the electric charges are always discarded to the charge discarding portion 14 by applying the constant voltage to the second electrode 14a. Therefore, the dispensable charges (residual electric charges) not used as the signal charges can be surely removed by the charge discarding portion 14.

By the way, even when the electric charges generated by the photoelectric converter 11 are stored as the signal charges in the charge storage portion 12 by applying the voltage to the first electrode 12a, the predetermined amounts of electric charges are sent as the dispensable charges to the charge discarding portion 14. Therefore, in the strict sense, to store sufficient amounts of the signal charges in the charge storage portion 12, it is needed to consider the magnitude relation between the voltages applied to the first and second electrodes. However, in a practical sense, since the voltage applied to the second electrode is constant, it is sufficient to control only the voltage applied to the first electrode. Other configuration and operation are substantially the same as the first embodiment.

<Fourth Embodiment>

This embodiment explains about a case of using an interline transfer CCD having a vertical-overflow drain, which is available in the market, as the image sensor 5 of FIG. 1.

Figure 5:
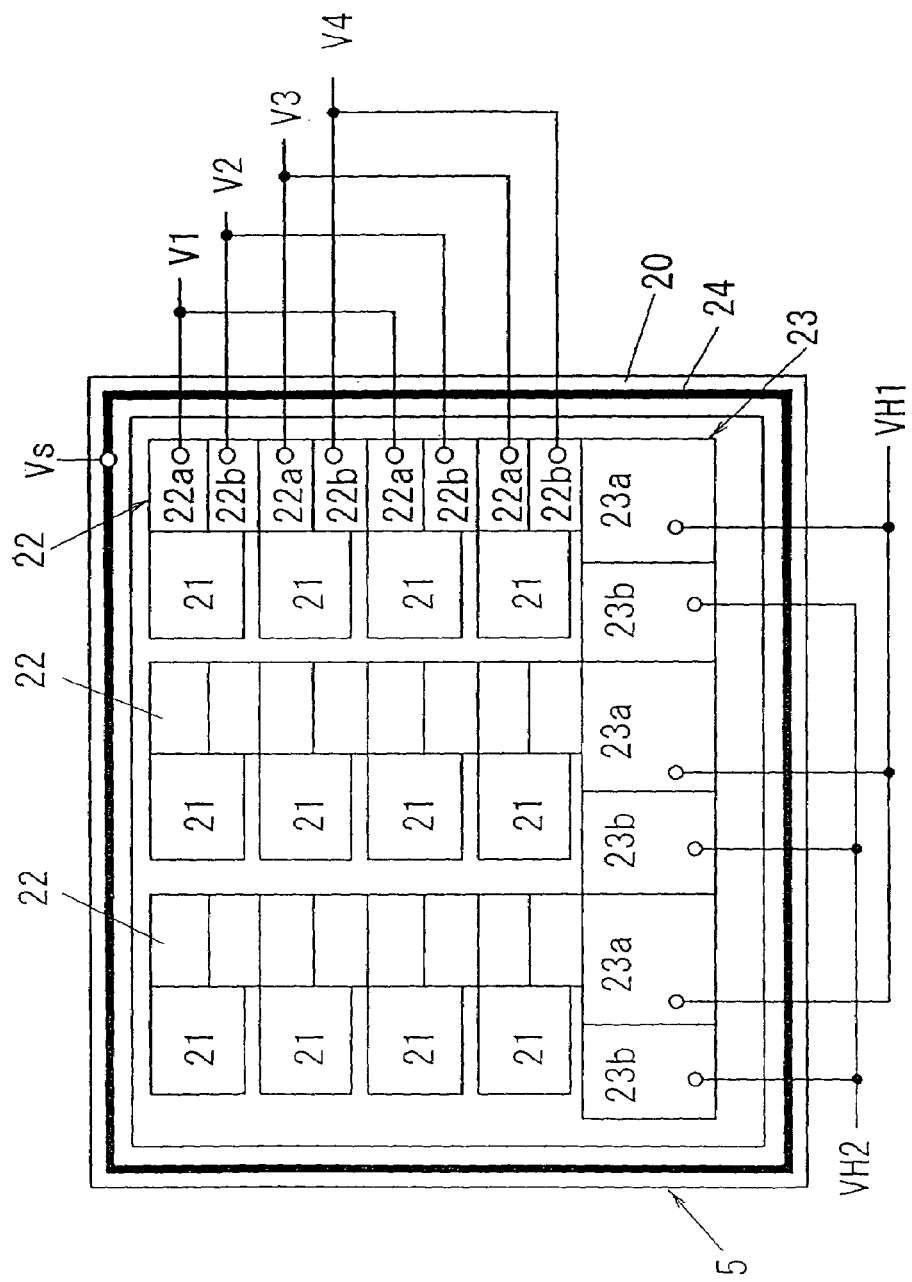
FIG. 5 is a plan view of an image sensor of a distance measuring apparatus according to a fourth embodiment of the invention.

As shown in FIG. 5, the image sensor 1 is a 2-dimensional image sensor having a matrix arrangement of 3×4 photodiodes 21. The numeral 22 designates a vertical transfer portion composed of a vertical transfer CCD, which is provided adjacent to the photodiodes 21 of each column of the matrix arrangement. The numeral 23 designates a horizontal transfer portion composed of a horizontal transfer CCD, which is provided at a lower side of the vertical transfer portions. In each of the vertical transfer portions 22, a pair of gate electrodes (22a, 22b) are provided every photodiode 21. In the horizontal transfer portion, a pair of gate electrodes (23a, 23b) are provided every vertical transfer portion 22.

The vertical transfer portion 22 is controlled by a 4-phase drive, and the horizontal transfer portion 23 is controlled by a 2-phase drive. That is, four phase control voltages (V1 to V4) are applied to the gate electrodes (22a, 22b) of the vertical transfer portion 22, and two phase control voltages (VH1, VH2) are applied to the gate electrodes (23a, 23b) of the horizontal transfer portion 23. Since this type of driving technique is well known in the field of conventional CCD, a further detail explanation is omitted.

The photodiodes 21, the vertical transfer portions 22 and the horizontal transfer portion 23 are formed on a single substrate 20. An overflow electrode 24 that is an aluminum electrode is directly formed on the substrate 20 not through an insulating film so as to surround the whole of the photodiodes 21, the vertical transfer portions 22 and the horizontal transfer portion 23, as shown in FIG. 5. When a required magnitude of a positive voltage (Vs) is applied to the overflow electrode 24, electric charges (electrons) generated by the photodiodes 21 are discarded through the overflow electrode 24.

That is, in this embodiment, the substrate 20 is used as a part of the overflow drain. Thus, since the overflow drain removes dispensable charges from the electric charges generated by the photodiodes 21 of the photoelectric converters 11, it functions as the charge discarding portion 14. Amounts of dispensable charges removed can be controlled by a voltage applied to the overflow electrode 24. Therefore, the overflow electrode 24 functions as the second electrode 14a.

Figure 6:
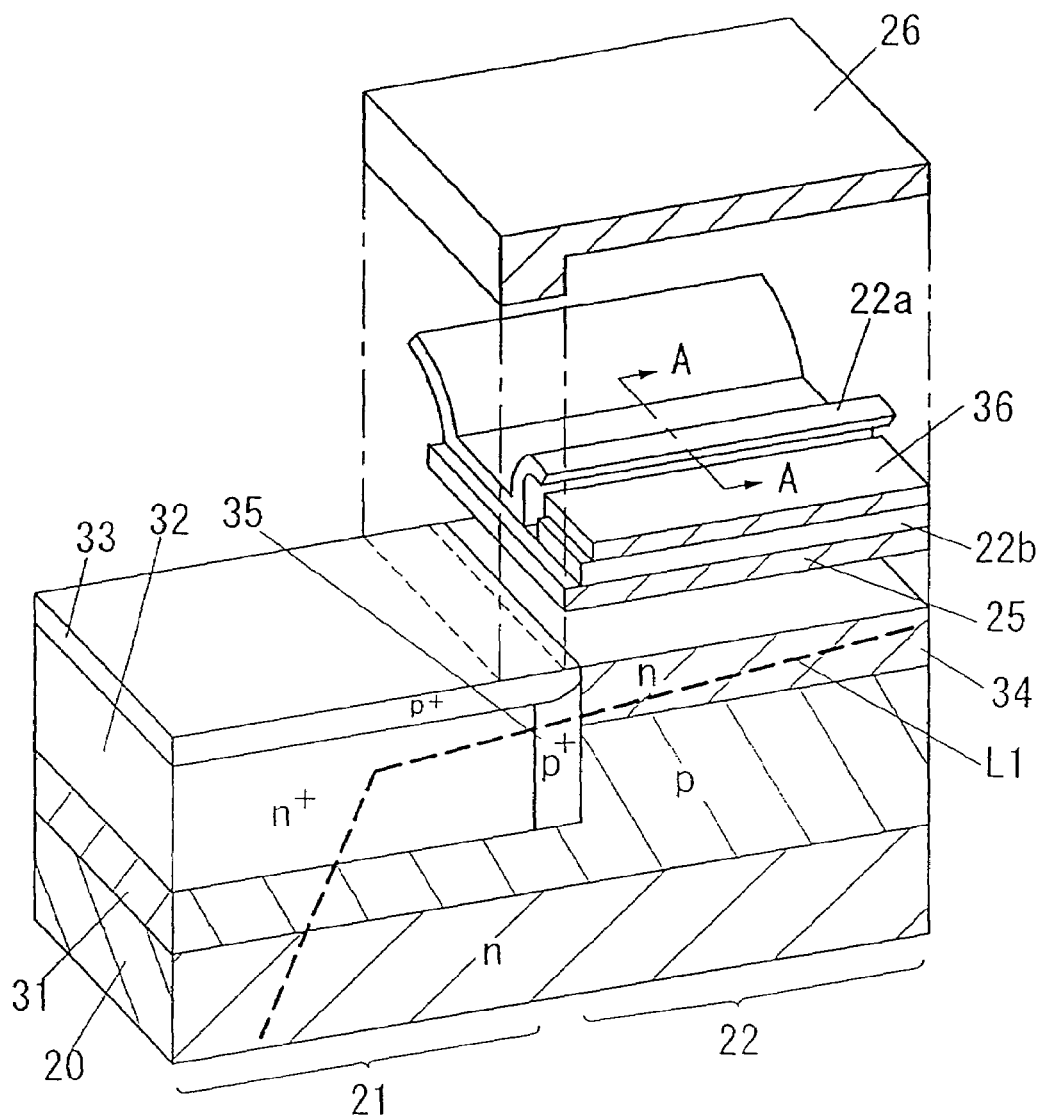
FIG. 6 is an exploded perspective view of a relevant portion of the image sensor.

Referring to FIG. 6, the image sensor 1 is more specifically explained. In the present embodiment, an n-type semiconductor substrate is used as the substrate 20. A p-well 31 of p-type semiconductor is formed on a general surface of the substrate 20 over regions for the photodiode 21 and the vertical transfer portion 22 such that a thickness of the p-well at the region for the vertical transfer portion 22 is greater than the thickness of the p-well at the region for the photodiode 21. In addition, an n$^+$-type semiconductor layer 32 is formed on the p-well 31 at the region for the photodiode 21. As a result, the photodiode 21 is composed of a p-n junction formed by the n$^+$type semiconductor layer 32 and the p-well 31. A p$^+$-type semiconductor surface layer 33 is formed on photodiode 21. A purpose of forming the surface layer 33 is to prevent that when sending the electric charges generated by the photodiodes 21 to the vertical transfer portion 22, a surface region of the n$^+$-type semiconductor layer 32 functions as a passage for the electric charges. This kind of photodiode is known as a buried photodiode.

On the other hand, a storage transfer layer 34 of n-type semiconductor is formed at the region corresponding to the vertical transfer portion 22 on the p-well 31. The top surface of the storage transfer layer 34 is substantially flush with the top surface of the surface layer 33, and the thickness of the storage transfer layer 34 is greater than the thickness of the surface layer 33. A side of the storage transfer layer 34 contacts the surface layer 33. A separation layer 35 of $p^+$-type semiconductor having the same impurity concentration as the surface layer 33 is formed between the $n^+$-type semiconductor layer 32 and the storage transfer layer 34. The gate electrodes 22a, 22b are formed on the storage transfer layer 34 through an insulating film 25. The gate electrode 22a is insulated from the gate electrode 22b by the insulating film 25. As described above, the gate electrodes 22a, 22b are formed every photodiode 21. One of the gate electrodes 22a, 22b has a larger width than the other one.

Figure 7:
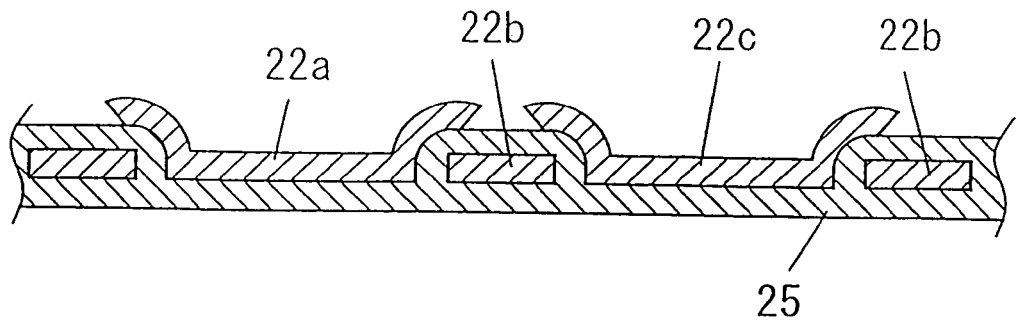
FIG. 7 is a cross-sectional view cut along the line A—A of FIG. 6 or 11.

Specifically, as shown in FIG. 7, the gate electrode 22b having the small width is configured in a planar shape, and the gate electrode 22a having the large width is formed with a flat portion and a pair of curved portions extending from opposite ends of the flat portion. The gate electrodes 22a, 22b are disposed such that the curved portion of the gate electrode 22a is partially overlapped with the gate electrode 22b in the height direction. In addition, the top surface of the flat portion of the gate electrode 22a is substantially flush with the top surface of the gate electrode 22b. Therefore, the gate electrodes 22a, 22b are alternately disposed on the storage transfer layer 34 in the length direction of the vertical transfer portion 22. The insulating film 25 is made of silicon dioxide. The gate electrodes 22a, 22b are made of polysilicon. In addition, a surface of the substrate 20 other than areas corresponding to the photodiodes 21 is covered with a light-shielding film 26.

Next, a mechanism of driving the image sensor 1 described above is explained. When the light provided from the space is incident on the photodiode 21, electric charges are generated by the photodiode 21. In addition, a ratio of the electric charges supplied as the signal charges into the vertical transfer portion 22 relative to the electric charges generated by the photodiodes 21 can be determined according to a relationship between the voltage applied to the gate electrode 22a and the voltage applied to the overflow electrode 24. Specifically, the above-described ratio is determined in accordance with a relationship between a depth of a potential well formed in the storage transfer layer 34 according to the voltage applied to the gate electrode 22a and a time period of applying the voltage to the gate electrode 22a, and a potential gradient formed between the photodiode 21 and the substrate 20 according to the voltage applied to the overflow electrode 24 and a time period of applying the voltage to the overflow electrode 24.

The voltages applied to the gate electrode 22a (corresponding to the first electrode 12a) and the overflow electrode 24 (corresponding to the second electrode 14a) can be controlled according to one of the voltage control methods explained in the first to third embodiments. In this embodiment, those voltages are controlled by the method of the first embodiment, i.e., such that the stage of applying the voltage to the gate electrode 22a is partially overlapped with the stage of applying the voltage to the overflow electrode 24, as shown in FIGS. 2A to 2D.

A ratio of the electric charges supplied to the vertical transfer portion 22 relative to the electric charges generated by the photodiode 21 changes in accordance with the voltages applied to the gate electrodes 22a, 22b. That is, at the vertical transfer portion 22, since the gate electrodes 22a, 22b are formed on the storage transfer layer 34 through the insulating film 25, a potential well is formed in the storage transfer portion 34 at the region corresponding to each of the gate electrodes 22a, 22b by applying the voltages to the gate electrodes 22a, 22b. As a result, the electric charges can be stored in a capacity determined by depth and width of the potential well. Thus, the potential well functions as the charge storage portion 12 for storing the signal charges.

In addition, the electric charges stored in the vertical transfer portion 22 can be output to the analyzer 5 through the horizontal transfer portion 23 by controlling a magnitude of the voltages applied to the gate electrodes 22a, 22b, 23a, 23b and the timings of applying the voltages to the respective gate electrodes. Therefore, the vertical transfer portion 22 and the horizontal transfer portion 23 function as the charge ejector 13.

Figure 8:
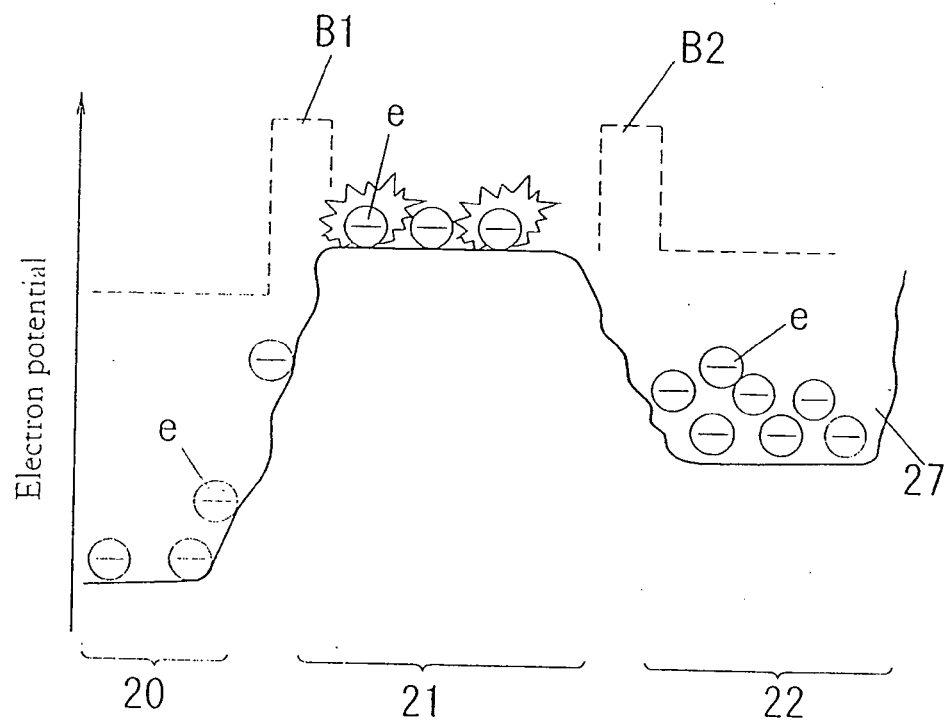
FIG. 8 is a potential diagram illustrating an operation of the distance measuring apparatus.

For example, by controlling the voltage applied to the overflow electrode 24, the electric charges generated by the photodiode 21 are allowed to migrate toward the vertical transfer portion 22, as described below. That is, FIG. 8 is a schematic diagram showing a change in electron potential along the dotted-line "L1" in FIG. 6. A region designated by the numeral 21 in FIG. 8 corresponds to the photodiode. A region designated by the numeral 20 in FIG. 8 corresponds to the substrate. A region designated by the numeral 22 in FIG. 8 corresponds to the vertical transfer portion. When the voltage is not applied to the overflow electrode 24, a potential barrier "B1" is formed by the p-well 31 between the photodiode 21 and the substrate 20. In addition, when the voltages are not applied to the gate electrodes 22a, 22b, a potential barrier "B2" is formed by the separation layer 35 between the photodiode 21 and the vertical transfer portion 22. Therefore, the height of the potential barrier "B2" can be changed by controlling magnitudes of the voltages applied to the gate electrodes 22a, 22b, and the height of the potential barrier "B1" can be changed by controlling a magnitude of the voltage applied to the overflow electrode 24. In FIG. 8, "e" designates electron.

Figure 9A:
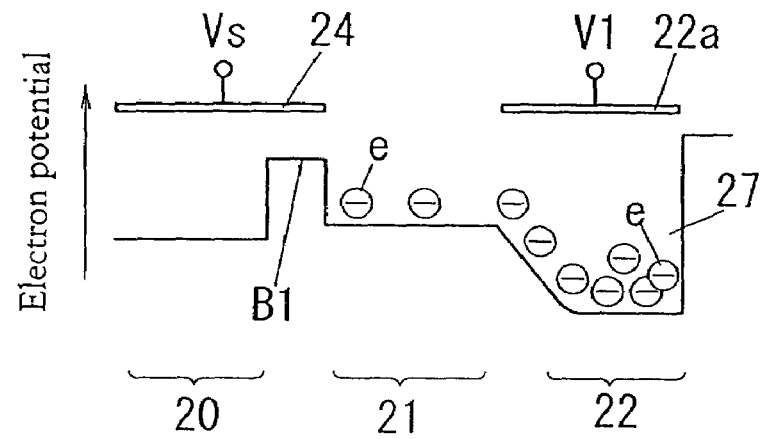
FIGS. 9A to 9C are potential diagrams illustrating another operations of the distance measuring apparatus.
Figure 9B:
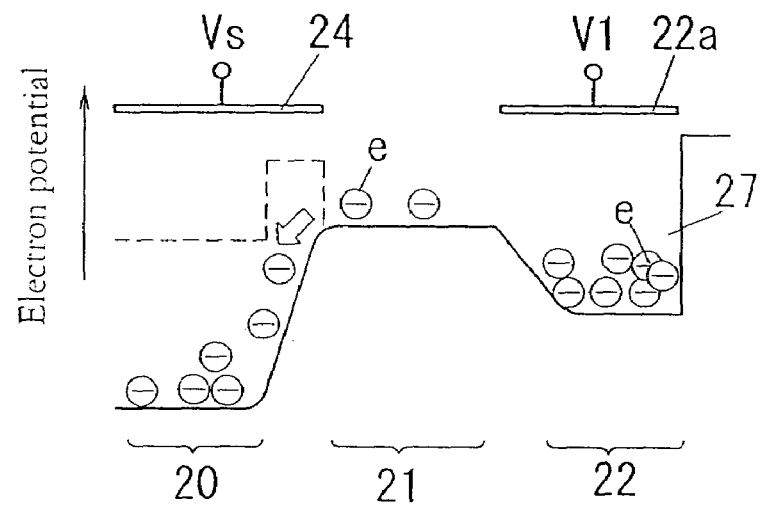
Figure 9C:
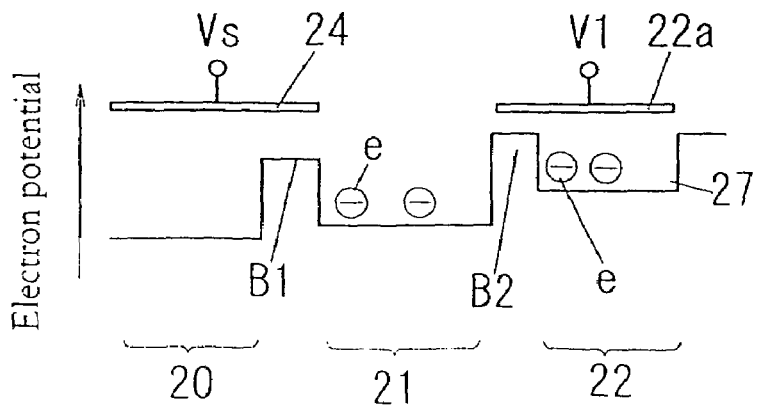

FIGS. 9A to 9C show relationships between voltages applied to the gate electrode 22a and the overflow electrode 24 and movements of the electric charges generated by the photodiode 21. In FIG. 9A, the potential barrier "B2" formed by the separation layer 35 is removed by applying a relatively high positive voltage (V1) to the gate electrode 22a, and a potential well 27 is formed in the storage transfer layer 34. At this time, a relatively low voltage (Vs) is applied to the overflow electrode 24 to form the potential barrier "B1". The electric charges generated by the photodiode 21 can not migrate toward the substrate 20 by the presence of the potential barrier "B1". As a result, the electric charges can not be discarded, and therefore the electric charges generated by the photodiode 21 migrate as the signal charges to the vertical transfer portion 22 as the capacity of the potential well 27 allows.

On the other hand, in FIG. 9B, a relatively high positive voltage (V1) is applied to the gate electrode 22a, as shown in FIG. 9A, and also a relatively high positive voltage (Vs) is applied to the overflow electrode 24. The voltage applied to the overflow electrode 24 is determined such that a potential of the substrate 20 is lower than the potential of the vertical transfer portion 22. Since the potential barrier "B1" formed by the p-well 31 is removed, and a potential gradient of the substrate 20 against the photodiode 21 is greater than the potential gradient of the vertical transfer portion 22 against the photodiode 21, most of the electric charges generated by the photodiodes 21 migrate as the dispensable charges to the substrate 20, and then discarded, as shown by the arrow in FIG. 9B.

That is, the ratio of the signal charges in the electric charges generated by the photodiode 21 remarkably reduces, as compared with the case of FIG. 9A. This means a reduction in sensitivity of the photoelectric converter 11. The sensitivity defined as a ratio of the signal charges and the dispensable charges is determined by the magnitude relation between the voltages applied to the gate electrode 22a and the overflow electrode 24. Since the electric charges (electrons) easily migrate toward a lower electron potential, the electric charges supplied into the vertical transfer portion 22 are stored in the potential well 27 having a lower potential than the photodiode 21, as shown in FIG. 9A, and the stored electric charges can not migrate toward the substrate 20, as shown in FIG. 9B.

To read out the signal charges stored in the vertical transfer portion 22, the applied voltage (V1) is removed from the gate electrode 22a (or a relatively small voltage (V1) may be applied to the gate electrode 22a) to form the potential barrier "B2". In addition, a relatively small voltage (Vs) is applied to the overflow electrode 24 to form the potential barrier "B1". The formation of the potential barrier "B1" is not necessarily required. It is important to form the potential barrier "B2". The formation of the potential barrier "B2" inhibits an inflow of the electric charges from the photodiode 21 to the vertical transfer portion 22, and an outflow of the electric charges from the vertical transfer portion 22 to the photodiode 21. Under this condition, the signal charges stored in the vertical transfer portion 22 are sent to the analyzer 5 through the horizontal transfer portion 23.

The signal charges stored in the vertical transfer portion 22 are read out every time that the signal charges corresponding to one intensity (A0~A3) of received light are detected. For example, after the signal charges corresponding to the integral "A0" are stored in the potential well 27, they are read out. Next, after the signal charges corresponding to the integral "A1" are stored in the potential well 27, they are read out. Thus, the procedures of storing and reading out the signal charges are repeated. It goes without saying that the time period of storing the signal charges corresponding to the intensity (A0~A3) of received light is constant. In addition, the sequence of reading out the signal charges corresponding to the intensity (A0~A3) of received light is not limited to the above-described case. For example, after the signal charges corresponding to the intensity (A0) of received light is extracted, the signal charges corresponding to the intensity (A2) of received light may be extracted. Other configuration and operation are substantially the same as the first embodiment.

<Fifth Embodiment>

This embodiment explains about a case of using an interline transfer CCD having a lateral-overflow drain, which is available in the market, as the image sensor 1 of FIG. 1.

Figure 10:
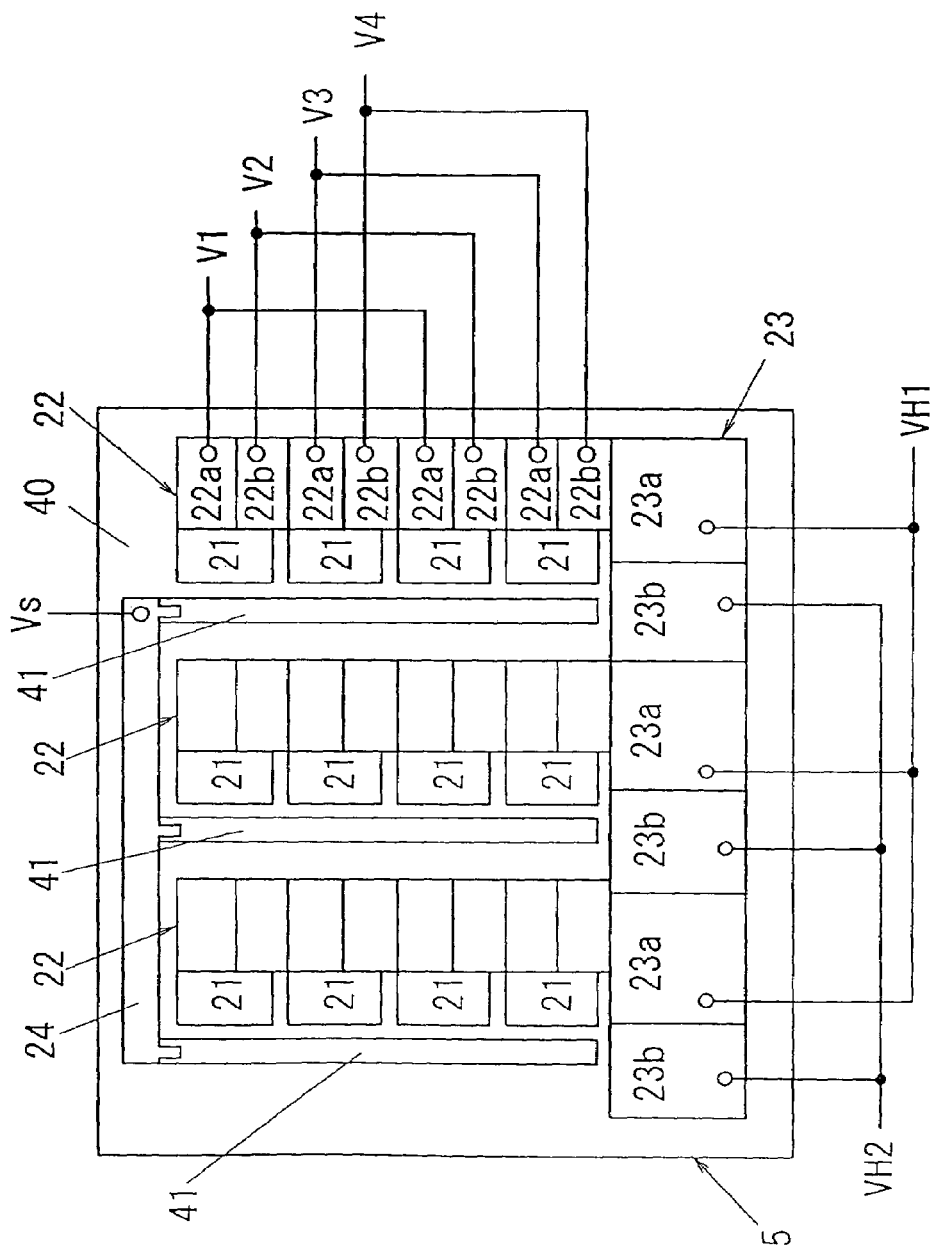
FIG. 10 is a plan view of an image sensor of a distance measuring apparatus according to a fifth embodiment of the invention.

In the image sensor 1 of this embodiment, as shown in FIG. 10, an overflow drain 41 of n-type semiconductor is formed adjacent to each of columns of a matrix arrangement (3×4) of the photodiodes 21. In this case, the image sensor 1 has three overflow drains 41. The overflow drains 41 are connected at their upper ends to each other by an overflow electrode 24 that is an aluminum electrode. The vertical transfer portion 22 and the horizontal transfer portion 23 have substantially same functions to them of the image sensor 1 of the fourth embodiment.

Figure 11:
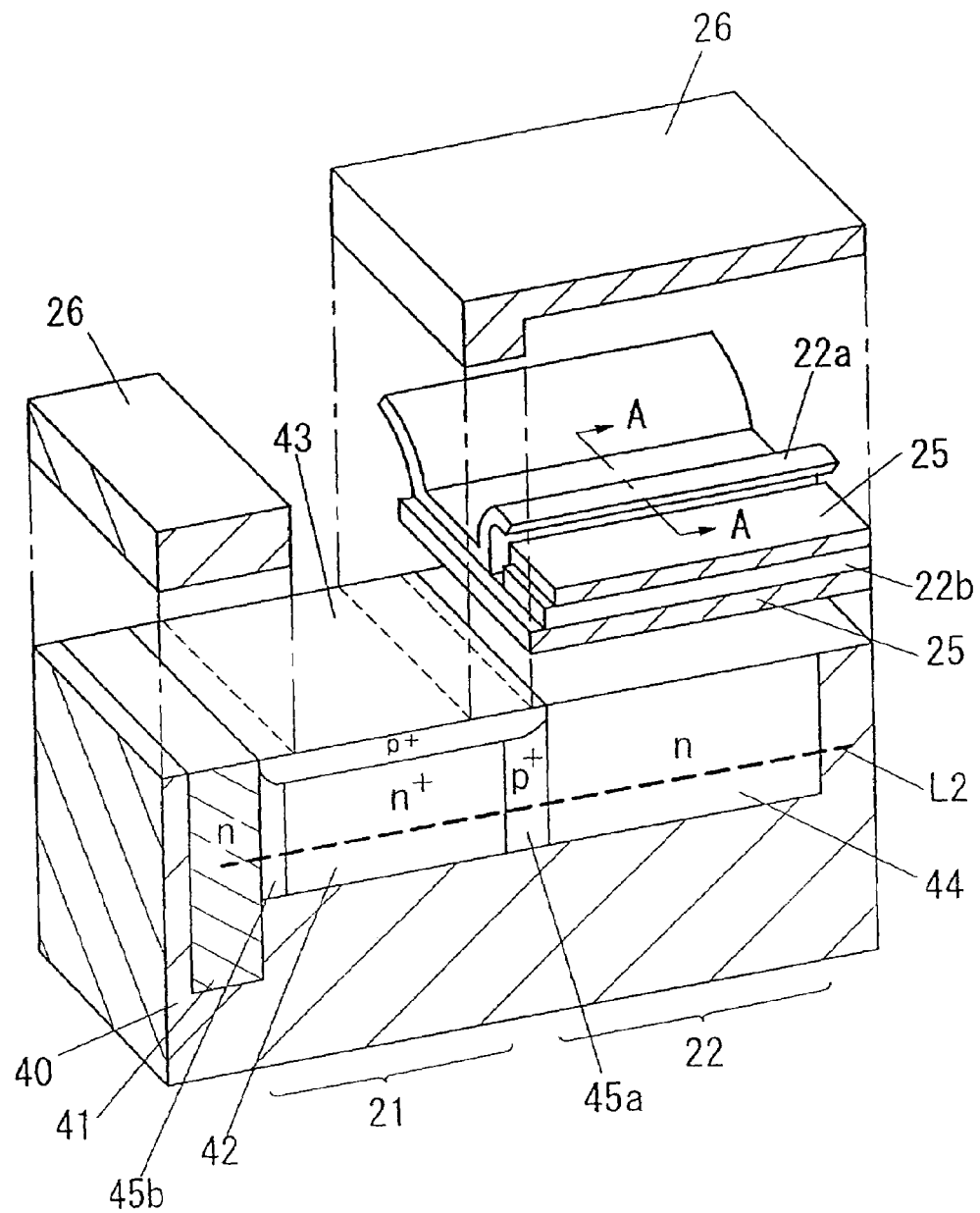
FIG. 11 is an exploded perspective view of a relevant portion of the image sensor.

Referring to FIG. 11, the image sensor 1 is more specifically explained. In the present embodiment, a p-type semiconductor substrate is used as the substrate 40. An n$^+$-type semiconductor layer 42 is formed in a general surface of the substrate 40 over a region, at which the formation of the photodiode 21 is intended. Therefore, the photodiode 21 is composed of the n$^+$-type semiconductor layer 42 and the substrate 40. On the other hand, a storage transfer layer 44 of n-type semiconductor is formed in the general surface of the substrate 40 over a region, at which the formation of the vertical transfer portion 22 is intended.

A separation layer 45a of p$^+$-type semiconductor is formed between the n$^+$-type semiconductor layer 42 and the storage transfer layer 44. A separation layer 45b of p$^+$-type semiconductor is formed between the n$^+$-type semiconductor layer 42 and the overflow drain 41. The numeral 43 designates a p$^+$-type semiconductor surface layer having the same impurity concentration as the separation layers 45a, 45b, which is formed on the n$^+$-type semiconductor layer 42 and the separation layers 45a, 45b. This surface layer 43 prevents that the electric charges generated by the photodiode 21 migrate to the vertical transfer portion 22 through the surface of the n$^+$-type semiconductor layer 42.

A top surface of the storage transfer layer 44 is substantially flush with the top surfaces of the surface layer 43 and the overflow drain 41. In addition, a thickness of the overflow drain 41 is larger than the thickness of the n$^+$-type semiconductor layer 42. Gate electrodes 22a, 22b are formed every photodiode 21 on the storage transfer layer 44 through an insulating film 25. One of the gate electrodes 22a, 22b has a larger width than the other one. In addition, the surface of the image sensor 1 other than areas for allowing the photodiodes 21 to receive the light is covered with a light-shielding film 26. These are same as the image sensor 1 of the fourth embodiment.

Figure 12:
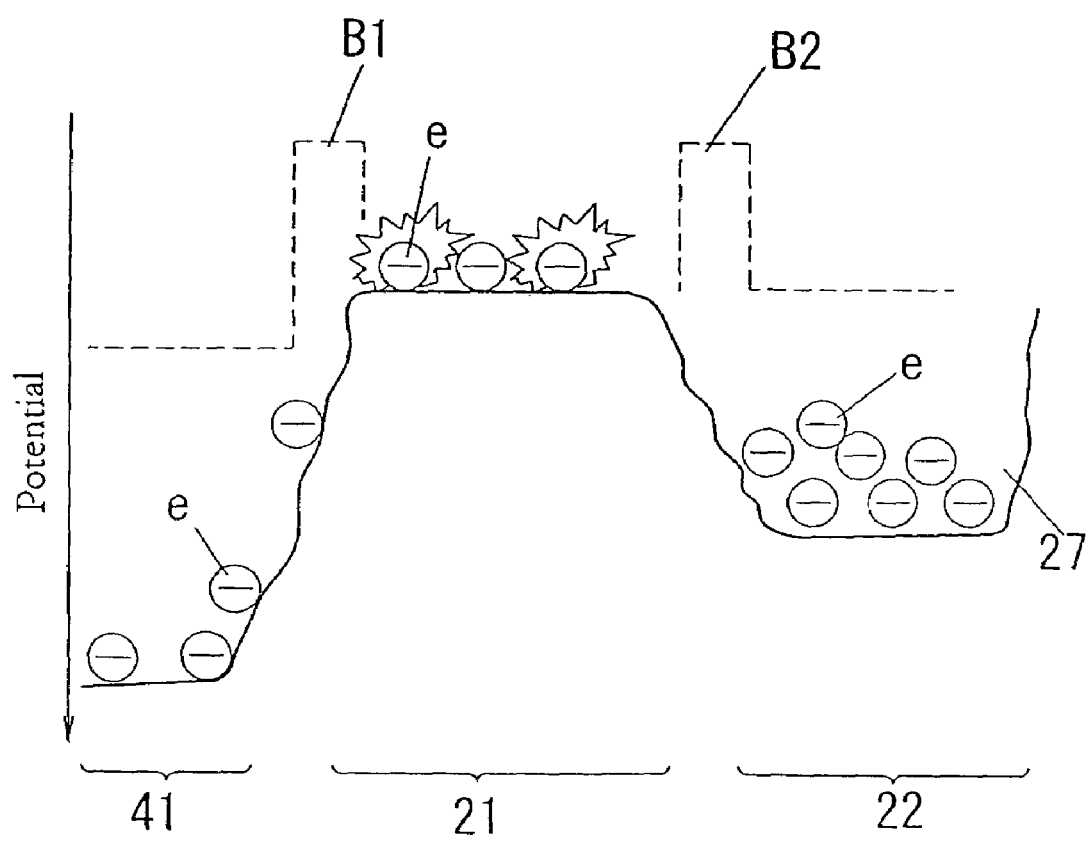
FIG. 12 is a potential diagram illustrating an operation of the distance measuring apparatus.
Figure 13A:
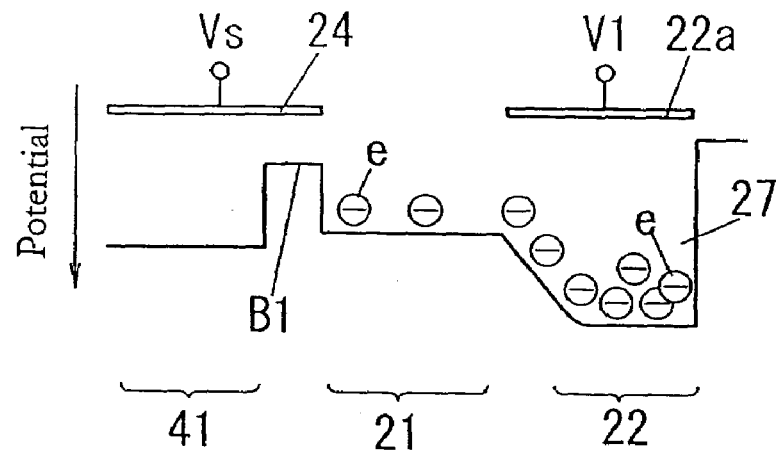
FIGS. 13A to 13C are potential diagrams illustrating another operations of the distance measuring apparatus.
Figure 13B:
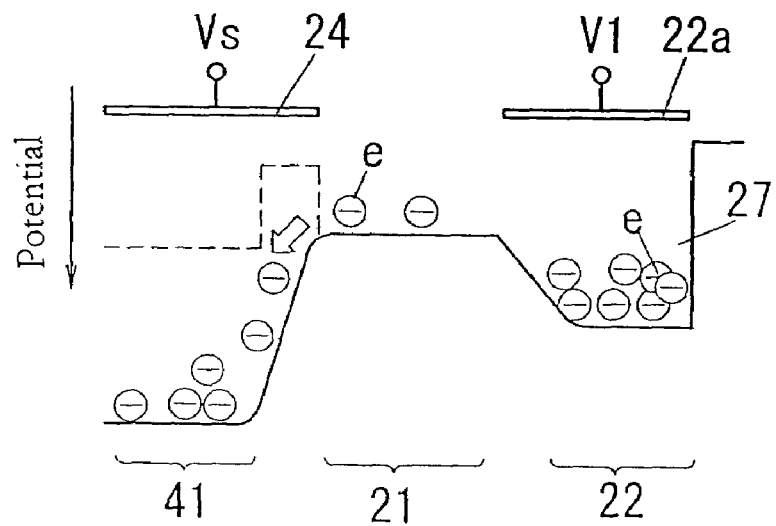
Figure 13C:
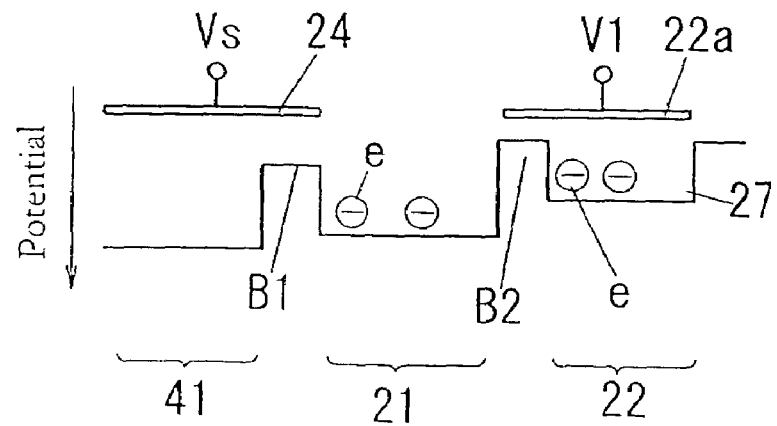

As understood from comparison between FIG. 12 showing a change in electron potential along the dotted line "L2" in FIG. 11, FIGS. 13A to 13C and FIGS. 8, 9A to 9C, the present embodiment is different from the fourth embodiment only in that the electric charges generated by the photodiode 21 are discarded by the overflow drain 41 in place of the substrate 20 of the fourth embodiment. In addition, as compared with the n$^+$-type semiconductor layer 32 constructing the photodiode 21 of the interline transfer CCD having the vertical-overflow drain according to the fourth embodiment, the photodiode 21 of the interline transfer CCD having the lateral-overflow drain according to the present embodiment can be formed by the n$^+$-type semiconductor layer 42 having a larger thickness.

That is, in the case of forming the vertical overflow drain, it is needed to form the photodiode 21 on the substrate 20. However, in the case of forming the lateral-overflow drain, since the substrate 40 is used as the semiconductor layer constructing the photodiode 21, it becomes possible to increase the thickness of the n$^+$-type semiconductor layer 42. In addition, there is an advantage that the sensitivity to infrared is improved, as compared with the fourth embodiment. Other configuration and performance are substantially the same as the fourth embodiment.

<Sixth Embodiment>

This embodiment explains about a case of using a frame transfer CCD having a vertical-overflow drain, which is available in the market, as the image sensor 1 of FIG. 1.

Figure 14:
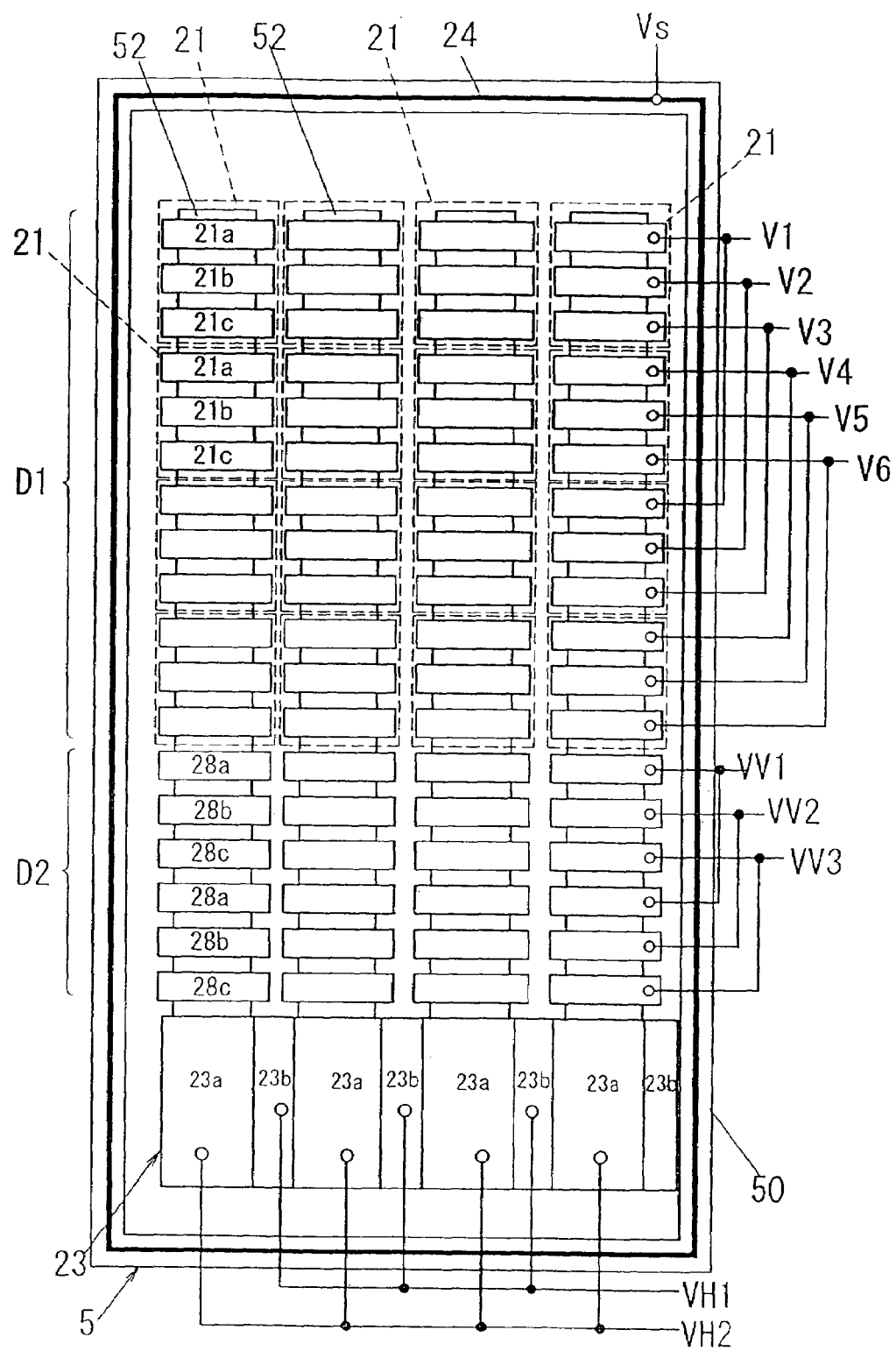
FIG. 14 is a plan view of an image sensor of a distance measuring apparatus according to a sixth embodiment of the invention.

As shown in FIG. 14, the image sensor 1 of this embodiment is a 2-dimensional image sensor having a matrix (4×4) arrangement of photodiodes 21. This image sensor 1 is provided with an image pickup portion "D1" including a plurality of vertical transfer CCDs, each of which is composed of the photodiodes 21 aligned in the vertical direction, and a storage portion "D2" formed adjacent to the image pickup portion "D1", which is an array of vertical transfer CCDs not having the photoelectric conversion capability. In FIG. 14, the numeral 23 designates a horizontal transfer portion formed adjacent to the storage portion "D2", which is composed of by a horizontal transfer CCD. The horizontal transfer portion functions as a charge ejector.

In this embodiment, the photodiode 21 and the vertical transfer CCD have the capability of storing electric charges and transferring the electric charges in the vertical direction. Therefore, the image pickup portion "D1" and the storage portion "D2" function as a charge storage portion. Each of the columns of the image pickup portion "D1" has four photodiodes 21, each of which is formed at the light receiving surface with three gate electrodes 21a~21c aligned in the vertical direction. Each of the columns of the storage portion "D2" has two sets of three gate electrodes 28a~28c. In addition, in the horizontal transfer portion 23, a pair of gate electrodes 23a, 23b are formed every column of the storage portion "D2", as in the case of the fourth embodiment.

The gate electrodes 21a~21c are driven by 6-phase control voltages "V1"~"V6", and the gate electrodes 28a~28c are driven by 3-phase control voltages "VV1"~"VV3". The gate electrodes 23a, 23b are driven by 2-phase control voltages "VH1", "VH2". The horizontal transfer portion 23 outputs the signal charges from the storage portion "D2" every one horizontal line. Since this type of driving technique is well known in the field of CCDs, further detailed explanation is omitted.

The image pickup portion "D1", the storage portion "D2" and the horizontal transfer portion 23 are formed on a single substrate 50. An overflow electrode 24 that is an aluminum electrode is formed directly on the substrate 50 not through an insulating film. That is, the substrate 50 functions as an overflow drain. The overflow electrode 24 is formed on the substrate 50 so as to surround the whole of the image pickup portion "D1", the storage portion "D2" and the horizontal transfer portion 23. A surface of the substrate 50 other than areas corresponding to the photodiodes 21 is covered with a light shielding film (not shown).

Figure 15:
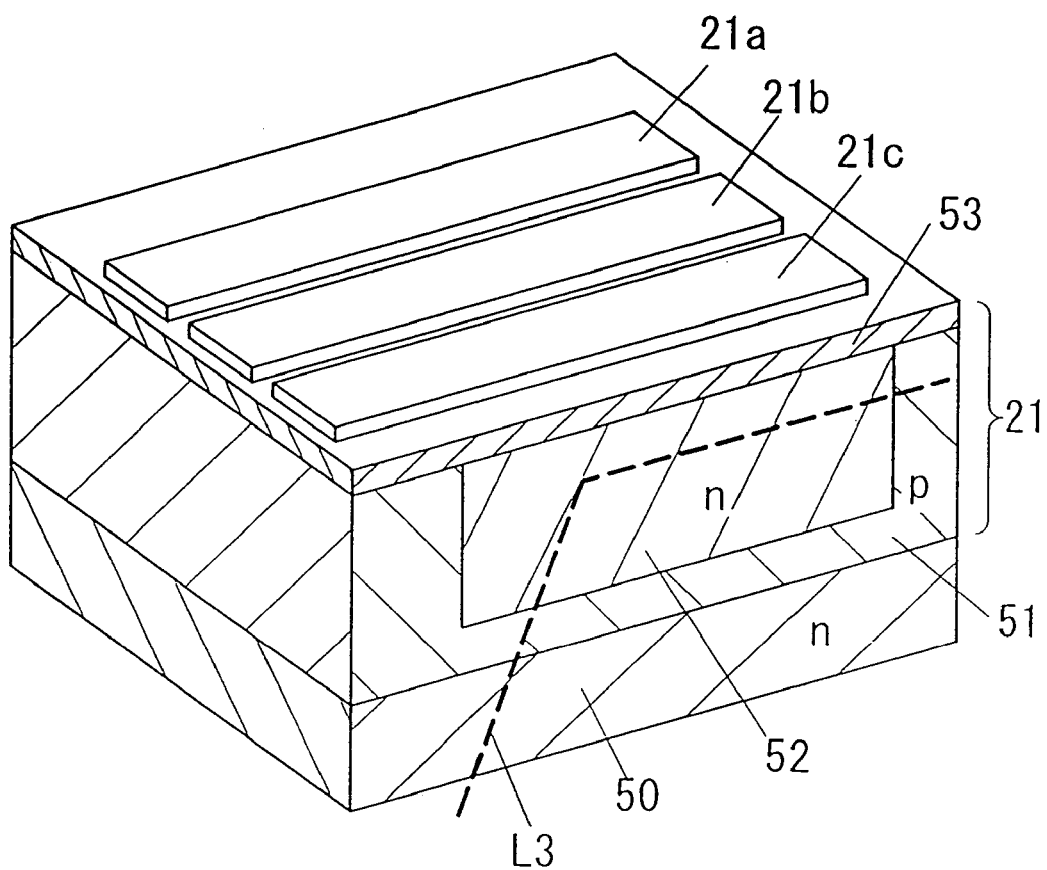
FIG. 15 is a perspective view of a relevant portion of the image sensor.

Referring to FIG. 15, the image sensor 1 is more specifically explained. In the present embodiment, an n-type semiconductor substrate is used as the substrate 50. A p-type semiconductor layer 51 is formed on a general surface of the substrate 50 over a region, at which the formation of the photodiode 21 is intended. In addition, an n-well 52 of n-type semiconductor is formed in the p-type semiconductor layer 51. The three gate electrodes 21a~21c are formed on top surfaces of the p-type semiconductor layer 51 and the n-well 52 through an insulating film 53 of silicon dioxide. That is, in this embodiment, a MIS-type photodiode 21 is formed by the n-well 52, the insulating film 53 and the gate electrodes 21a to 21c. Each of the gate electrodes 21a~21c is made of polysilicon. The n-well 52 is continuously formed over the image pickup portion "D1" and the storage portion "D2". In the n-well 52 of the image pickup portion "D1", the electric charges are generated, stored and transferred, and in the n-well 52 of the storage portion "D2", the electric charges are stored and transferred.

Next, a mechanism of driving the image sensor 1 described above is explained. When the light provided from the space is incident on the photodiode 21, electric charges are generated by the photodiode 21. When suitable voltages are applied to the gate electrodes 21a~21c, a potential well is formed as the charge storage portion in the n-well 52. Therefore, the generated electric charges can be stored in the potential well. In addition, the depth of the potential well can be changed by controlling the voltages applied to the gate electrodes 21a~21c to transfer the electric charges. On the other hand, when a suitable voltage "Vs" is applied to the overflow electrode 24, the electric charges generated by the photodiode 21 are discarded through the substrate 50. Therefore, by controlling the voltage applied to the overflow electrode 24 and a time period of applying the voltage to the overflow electrode 24, it is possible to change a ratio of the signal charges stored in the potential well of the n-well 52 relative to the electric charges generated by the photodiode 21.

Figure 16:
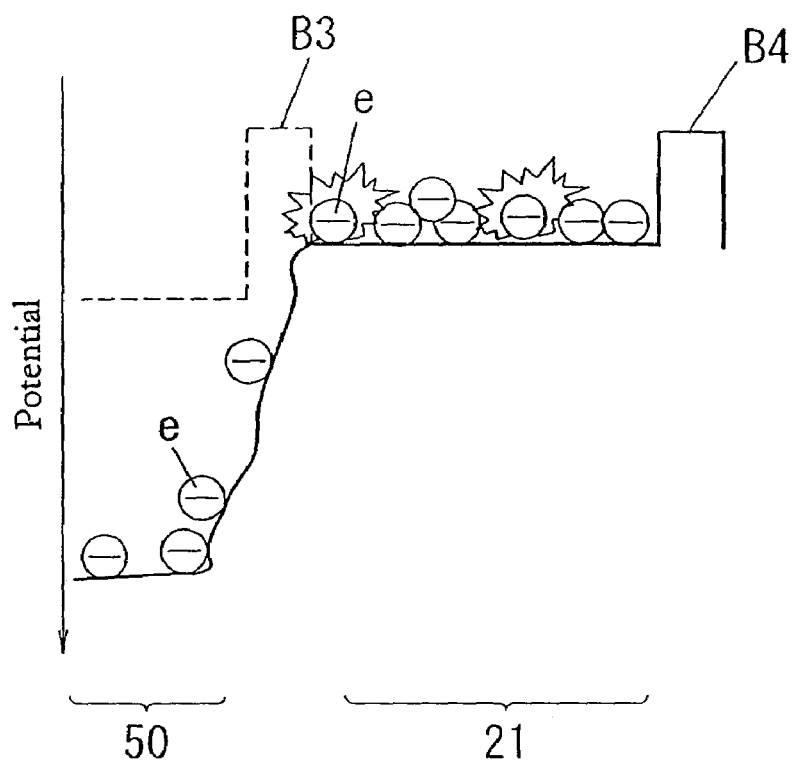
FIG. 16 is a potential diagram illustrating an operation of the distance measuring apparatus.

Referring to FIG. 16 showing a change in electron potential along the dotted line "L3" in FIG. 15, migrations of electric charges generated by the photodiode 21 are explained. The region designated by the numeral 21 in FIG. 16 corresponds to the photodiode. The region designated by the numeral 50 in FIG. 16 corresponds to the substrate. When no voltage is applied to the overflow electrode 24, a potential barrier "B3" is formed by the p-type semiconductor layer 51 between the photodiode 21 (n-well 52) and the substrate 50. On the other hand, at the opposite side of the photodiode 21, a potential barrier "B4" is formed by the p-type semiconductor layer 51 to prevent a leakage of the electric charges (electrons "e") generated by the photodiode 21 to the outside. A height of the potential barrier "B3" can be changed by controlling a magnitude of the voltage applied to the overflow electrode 24.

Figure 17:
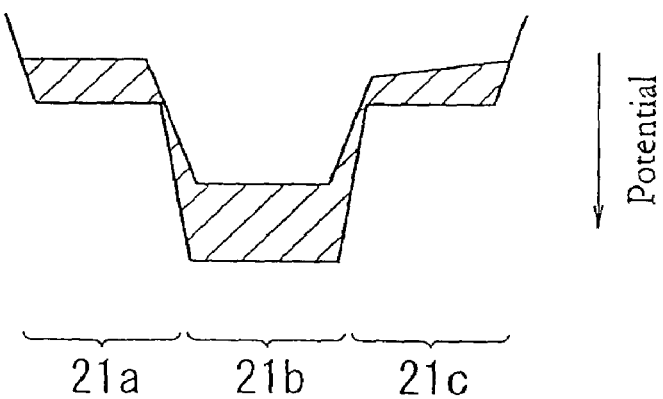
FIG. 17 is potential diagram illustrating another operation of the distance measuring apparatus.

On the other hand, amounts of electric charges stored in the potential well, which is formed in the n-well 52 by applying the voltages to the gate electrodes 21a~21c, are determined according to the depth of the potential well, which can be changed by controlling magnitudes of the voltages applied to the gate electrodes 21a~21c. That is, when the magnitude of the voltage applied to the gate electrode 21b is higher than the magnitudes of the voltages applied to the gate electrodes 21a, 21c, the potential well is formed to have a maximum depth at its center region, as shown in FIG. 17.

Figure 18A:
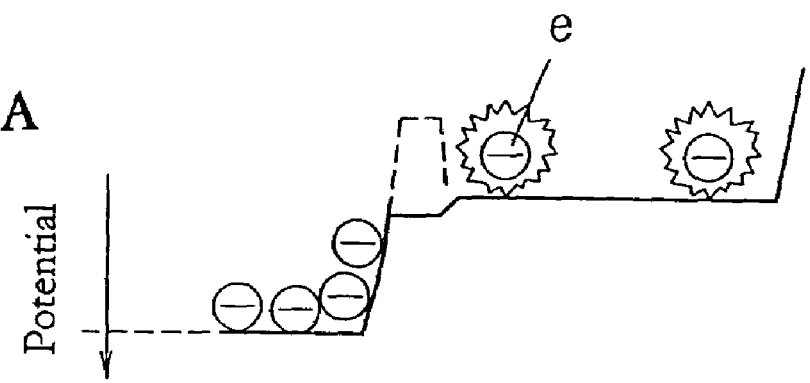
FIGS. 18A to 18C are potential diagrams illustrating still another operations of the distance measuring apparatus.
Figure 18B:
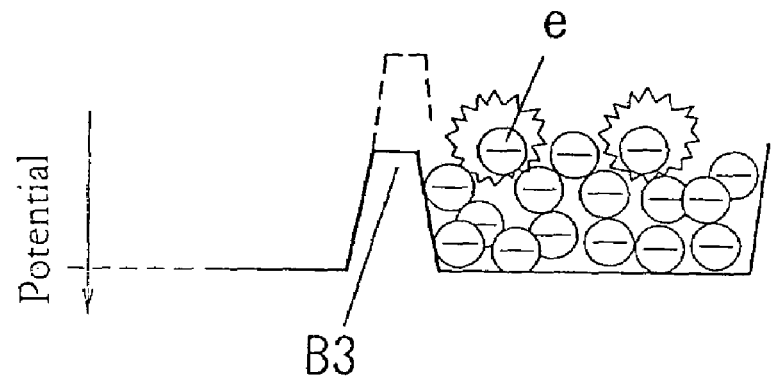
Figure 18C:
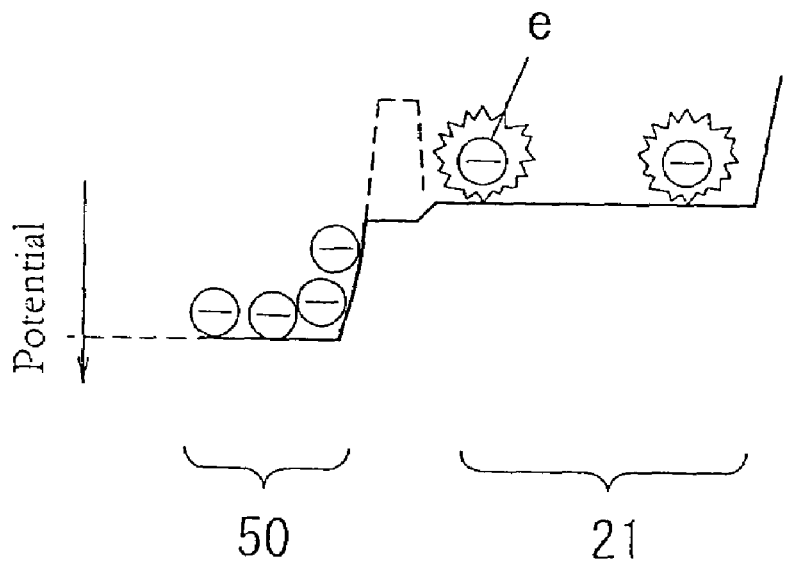

By applying a suitable voltage to the overflow electrode 24 such that the potential of the substrate 50 is lower than the potential of the n-well 52, voltages to the gate electrodes 21a, 21c to remove the potential barrier "B3", and a voltage to the gate electrode 21b to form the potential barrier "B3", as shown in FIGS. 18A to 18C, it is possible to store large amounts of electric charges (electrons "e") at the center region of the potential well shown in FIG. 18B, and discard the electric charges at the both side regions shown in FIGS. 18A and 18C through the substrate 50.

By the way, parts of electric charges generated at the side gate electrodes 21a, 21c may flow into the potential well 27 corresponding to the center gate electrode 21b as noise components during a time period that the electric charges are generated by the photodiode 21. In addition, since the signal charges are transferred every time that the signal charges corresponding to one intensity (A0, A1, A2, A3) of received light can be detected, the electric charges generated by the photodiode 21 may be mixed as the noise components during a time period of transferring the signal charges. However, these noise components are averaged by integration, and substantially removed by subtraction performed to determine the phase difference "ψ". Therefore, the influence of these noise components becomes small. As a result, it is possible to accurately determine the phase difference "ψ" even when using the frame transfer CCD.

In the above case, the three gate electrodes 21a~21c are formed every photodiode 21. However, the number of gate electrodes corresponding to one photodiode is not limited to this embodiment. Other configuration and performance are substantially the same as the fourth embodiment.

<Seventh Embodiment>

This embodiment explains about a case of using a frame transfer CCD having a lateral-overflow drain, which is available in the market, as the image sensor 1 of FIG. 1.

Figure 19:
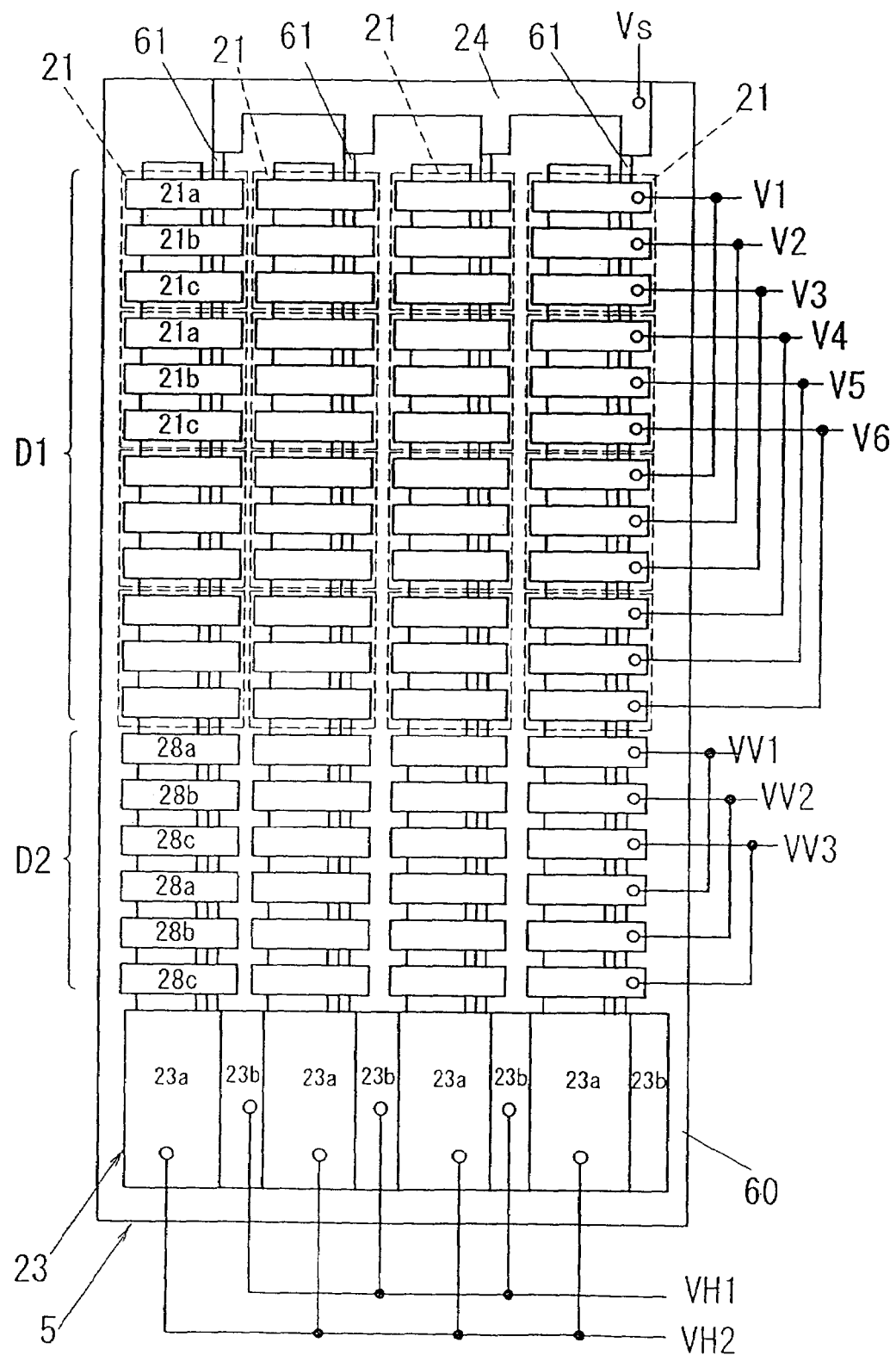
FIG. 19 is a plan view of an image sensor of a distance measuring apparatus according to a seventh embodiment.

As shown in FIG. 19, the image sensor 1 of this embodiment is a 2-dimensional image sensor having a matrix (4×4) arrangement of photodiodes 21.

An overflow drain 61 of n-type semiconductor is formed for each of columns of the matrix arrangement of the photodiodes 21. In this embodiment, the image sensor 1 has four overflow drains 61. The overflow drains 61 are connected at their upper ends to each other by an overflow electrode 24 that is an aluminum electrode. The image pickup portion "D1", the storage portion "D2" and the horizontal transfer portion 23 have the same functions to them of the image sensor 1 of the sixth embodiment.

Figure 20:
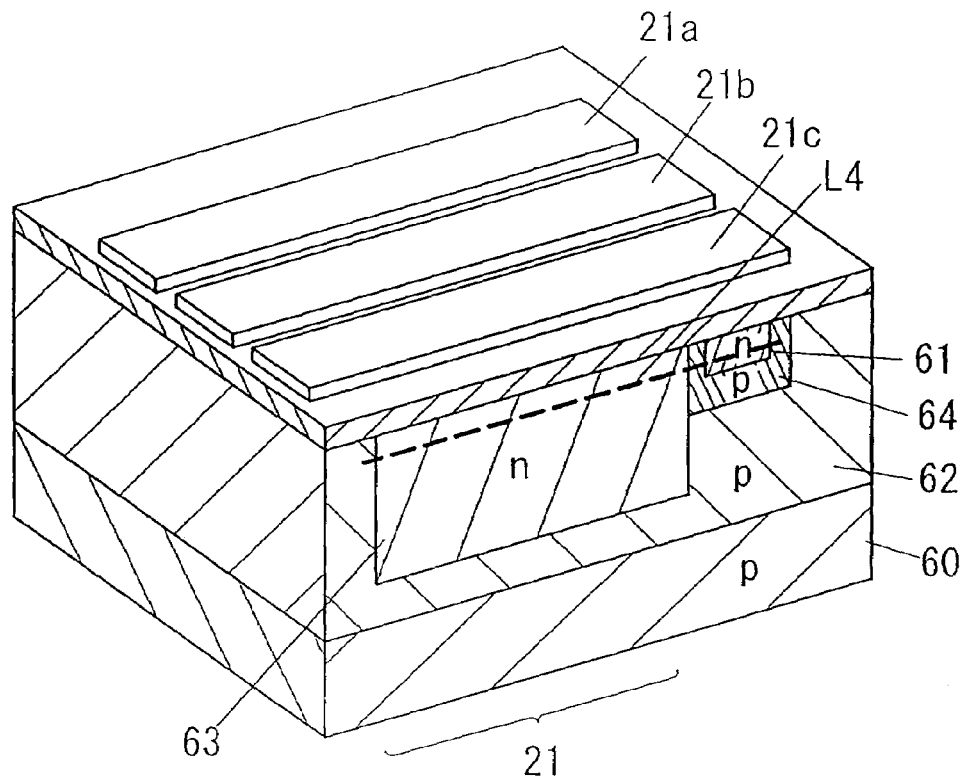
FIG. 20 is a perspective view of a relevant portion of the image sensor.

Referring to FIG. 20, the image sensor 1 of this embodiment is more specifically explained. That is, a p-type semiconductor substrate is used as the substrate 60. A p-type semiconductor layer 62 is formed on a general surface of the substrate 60. In addition, an n-well 63 of n-type semiconductor is formed in the p-type semiconductor layer 62. Therefore, the photodiode 21 is composed of the p-type semiconductor layer 62 and the n-well 63 provide. A $p^+$-well 64 of $p^+$-type semiconductor is formed adjacent to the n-well 63 in the p-type semiconductor layer 62. The overflow drain 61 of n-type semiconductor is formed in a top surface of the $p^+$-well 64. Thus, the image sensor 1 of this embodiment has basically same structure as the image sensor of the sixth embodiment except for using the substrate 60 having a different conductivity type and forming the overflow drain 61. As compared with the sixth embodiment, there is an advantage that the image sensor of this embodiment has a higher sensitivity to infrared.

Figure 21:
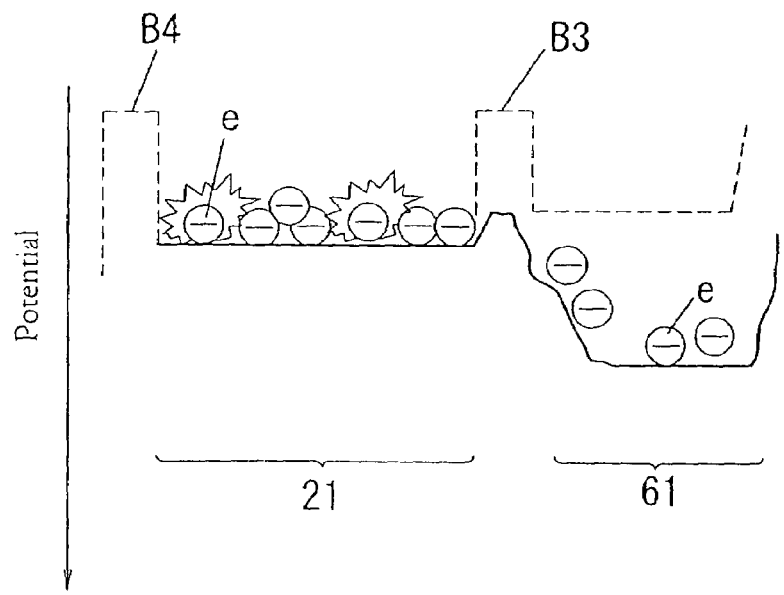
FIG. 21 is a potential diagram illustrating an operation of the distance measuring apparatus.

As understood from comparison between FIG. 21 showing a change in electron potential along the dotted line "L4" of FIG. 20 and FIG. 16, the present embodiment is different from the sixth embodiment in that the electric charges generated by the photodiode 21 are discarded through the overflow drain 61 in place of the substrate 50 of the sixth embodiment. Amounts of electric charges stored in a potential well, which is formed in the n-well 63 by applying voltages to gate electrodes 21a~21c, are determined by the depth of the potential well, which can be changed by controlling magnitudes of the voltages applied to the gate electrodes 21a~21c. That is, when the magnitude of the voltage applied to the gate electrode 21b is higher than the magnitudes of the voltages applied to the gate electrodes 21a, 21c, the potential well corresponding to the center gate electrode 21b has a maximum depth.

Figure 22A:
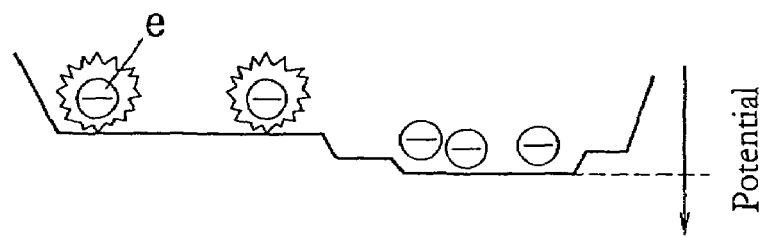
FIGS. 22A to 22C are potential diagrams illustrating another operations of the distance measuring apparatus.
Figure 22B:
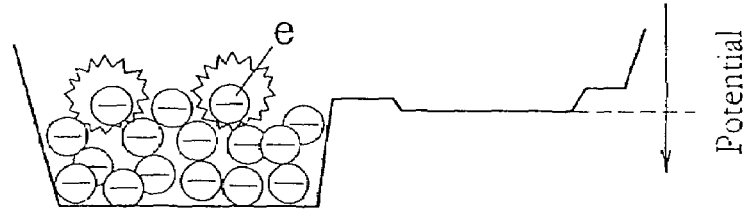
Figure 22C:
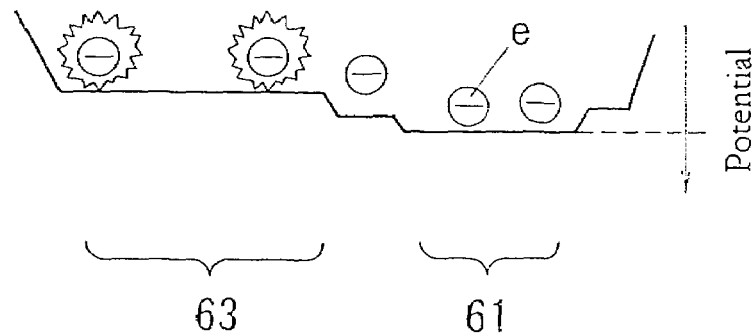

When a suitable voltage is applied to the overflow electrode 24 to lower the potential barrier "B3", electric charges (electrons "e") are stored in the potential well corresponding to the center gate electrode 21b, as shown in FIG. 22B, and electric charges generated at the regions corresponding to the side gate electrodes 21a, 21c are discarded by the overflow drain 61, as shown in FIGS. 22A and 22C. Other configuration and performance are substantially the same as the sixth embodiment.

<Eighth Embodiment>

As explained in the sixth and seventh embodiments, when using the frame transfer CCD as the image sensor 1, the number of gate electrodes formed every photodiode 21 is not limited to three. In this embodiment, four gate electrodes are formed every photodiode 21.

Figure 23A:
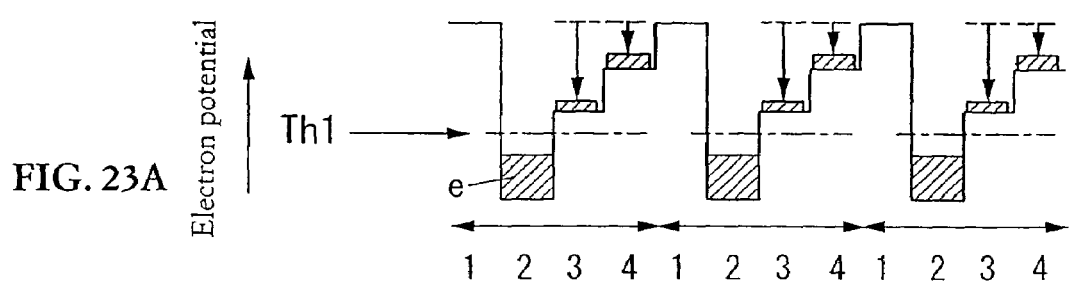
FIGS. 23A and 23B are potential diagrams illustrating operations of a distance measuring apparatus according to an eighth embodiment of the invention.
Figure 23B:
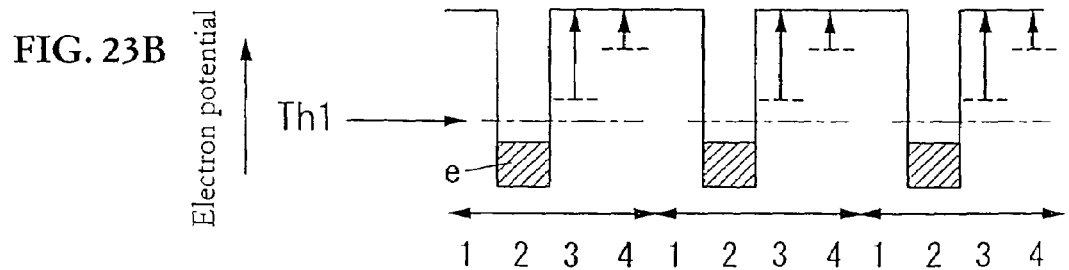

In FIGS. 23A and 23B, the numerals 1~4 respectively designate first, second, third and fourth gate electrodes. One cycle of the numerals 1~4 corresponds to one photodiode 21. FIG. 23A shows a charge storing period of storing electric charges generated by the photodiode 21, and FIG. 23B shows a charge discarding period of discarding dispensable charges. A threshold value "Th1" designates a potential of overflow drain.

As shown in FIG. 23A, in the charge storing period, a potential barrier is formed between adjacent photodiodes 21 by not applying a voltage to the first gate electrode (1) in order to prevent that that electric charges generated by the photodiodes 21 are mixed to each other. In addition, when magnitudes of voltages applied to the second, third and the fourth gate electrodes (2)~(4) are changed in a stepwise manner, it is possible to obtain a step-like potential well having different depths. Each of regions of the potential well corresponding to the third and fourth gate electrodes (3), (4) has an electron potential higher than the threshold value "Th1". The potential well has a maximum depth (the lowest electron potential) at a region corresponding to the second gate electrode (2). Since this electron potential is lower than the threshold value "Th1", electric charges (electrons "e") generated by the photodiode 21 are mainly stored in the region corresponding to the second gate electrode (2).

On the other hand, as shown in FIG. 23B, in the charge discarding period, electron potentials of the regions corresponding to the third and fourth gate electrodes (3), (4) are increased to prevent a leakage of electric charges stored in the region corresponding to the second gate electrode (2) that has the lowest electron potential within the charge storing period. Thereby, electric charges generated at the regions corresponding to the first, third and the fourth gate electrodes (1), (3), (4) in the charge storing period flow into the overflow drain and the region corresponding to the second gate electrode (2). In other words, in the charge storing period shown in FIG. 23B, the voltages applied to the gate electrodes (1) to (4) are controlled to form potential barriers for electrically isolating the region corresponding to the second gate electrode (2) having the lowest electron potential from the circumstances. Therefore, it is possible to change a ratio of the dispensable charges to be discarded relative to the electric charges generated by the photodiode 21 by adequately controlling a ratio of the charge storing period to the charge discarding period. This means that the sensitivity is adjustable. Other configuration and performance are substantially the same as the sixth or seventh embodiment.

<Ninth Embodiment>

Figure 24A:
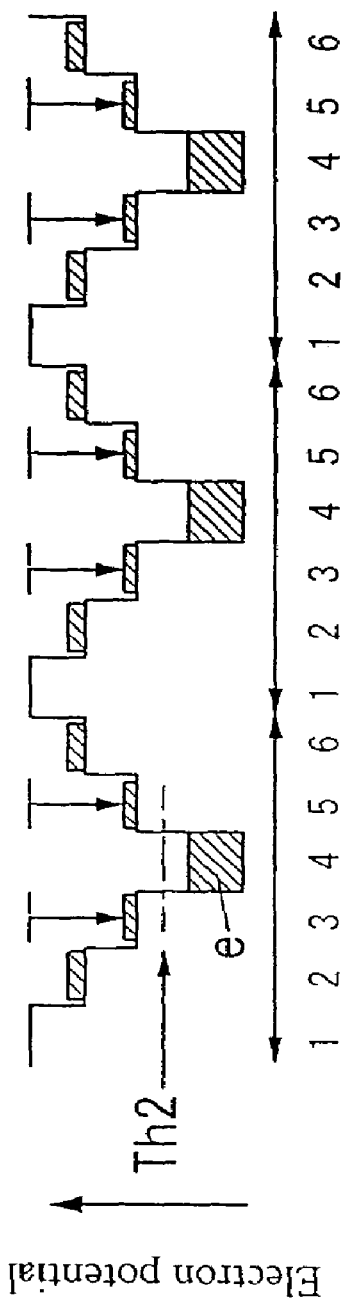
FIGS. 24A and 24B are potential diagrams illustrating operations of a distance measuring apparatus according to a ninth embodiment of the invention.
Figure 24B:
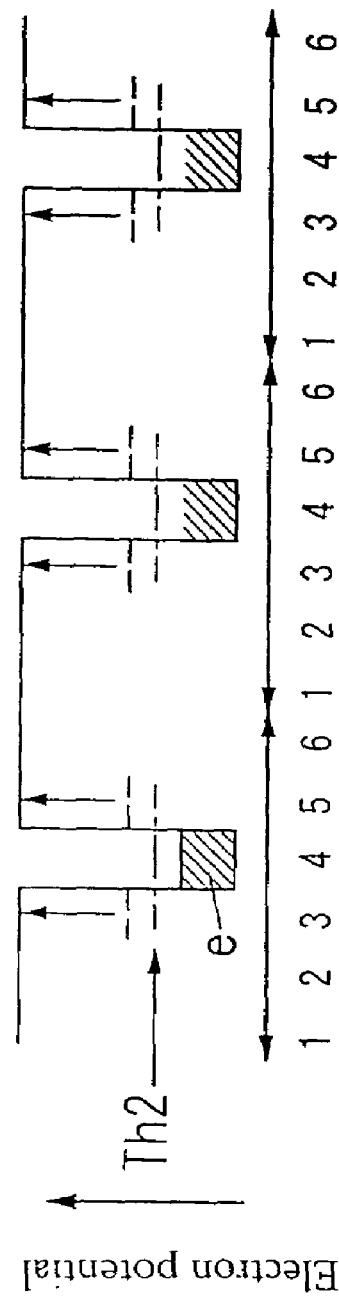

In this embodiment, six gate electrodes are formed every photodiode 21. In FIGS. 24A and 24B, the numerals 1~6 respectively designate first, second, third, fourth, fifth and sixth gate electrodes. One cycle of the numerals 1~6 corresponds to one photodiode 21. FIG. 24A shows a charge storing period of storing electric charges generated by the photodiode 21, and FIG. 24B shows a charge discarding period of discarding dispensable charges. A threshold value "Th2" designates a potential of overflow drain.

As shown in FIG. 24A, in the charge storing period, a potential barrier is formed between adjacent photodiodes 21 by not applying a voltage to the first gate electrode (1) in order to prevent that electric charges generated by the photodiodes 21 are mixed to each other. The potential well has a maximum depth at a region corresponding to the fourth gate electrode (4). Electron potentials of regions corresponding to the second, third, fifth and the sixth gate electrodes (2), (3), (5), (6) are changed in a stepwise manner so as to be higher than the threshold value "Th2". Since the region of the potential well corresponding to the fourth gate electrode (4) has the maximum depth, which is lower than the threshold value "Th2", electric charges (electrons "e") generated by the photodiode 21 are mainly stored in this region.

Figure 25A:
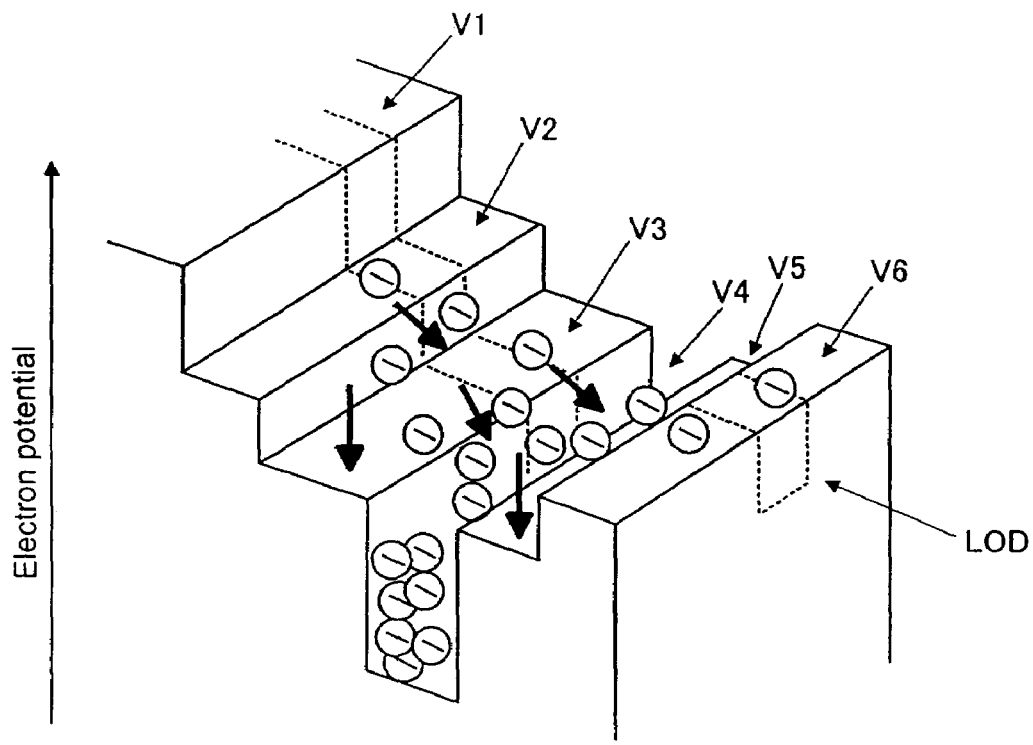
FIGS. 25A and 25B are explanatory diagrams 3-dimensionally illustrating electron potentials generated under gate electrodes within a charge storing stage and a charge discarding stage, respectively.

FIG. 25A is an explanatory view of 3-dimensionally illustrating the electron potentials of the regions corresponding to the gate electrodes (1) to (6) in the charge storing period. "V1" to "V6" shown in this figure respectively correspond to vertical transfer voltages "V1" to "V6" shown in FIG. 19, and "LOD" corresponds to overflow drains 61. Electrons lying in regions corresponding to the gate electrodes (2) and (6), to which the voltages "V2" and "V6" are being applied, migrate toward regions corresponding to the gate electrodes (3) and (5), to which the voltages "V3" and "V5" are being applied. In addition, the electrons lying in the regions corresponding to the gate electrodes (3) and (5) migrate toward a region corresponding to the gate electrode (4), to which the voltage "V4" is being applied. As a result, the electrons are stored in the region of the potential well corresponding to the gate electrode (4).

On the other hand, as shown in FIG. 24B, in the charge discarding period, electron potentials of the regions corresponding to the second, third, fifth and sixth gate electrodes (2), (3), (5), (6) are increased to prevent a leakage of electric charges stored in the region corresponding to the fourth gate electrode (4) that has the lowest electron potential within the charge storing period. Thereby, electric charges generated at the regions corresponding to the first, second, third, fifth and sixth gate electrodes (1), (2), (3), (5), (6) in the charge storing period flow into the overflow drain and the region corresponding to the fourth gate electrode (4).

Figure 25B:
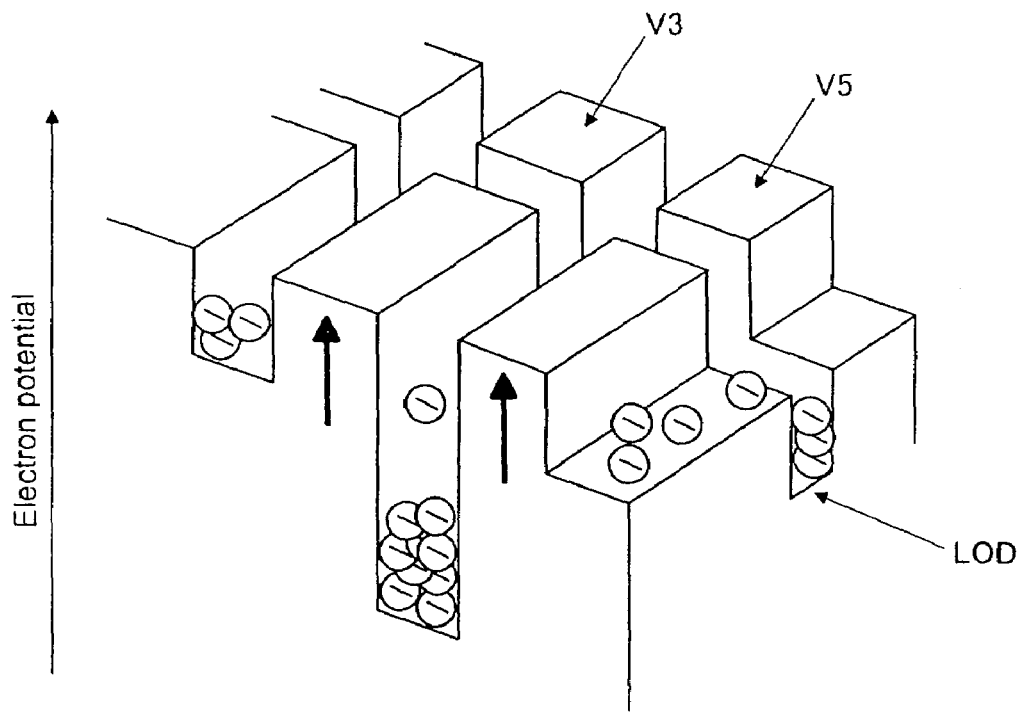

FIG. 25B is an explanatory view of 3-dimensionally illustrating the electron potentials of the regions corresponding to the gate electrodes (1) to (6) in the charge discarding period. When the voltages "V3" and "V5" are reduced so as to be substantially equal to the voltage "V", the region corresponding to the gate electrode (4), to which the voltage "V4" is being applied, is electrically isolated from the circumstances, so that an inflow of electrons to the region is inhibited. In addition, by setting the electron potential of the overflow drain (LOD) electrode to be higher than the gate electrode (4), to which the voltage "V4" is being applied, and lower than the gate electrodes (2), (6), to which the voltages "V2", "V6" are being applied, it is possible to discard the electrons generated at the regions corresponding to the gate electrodes (2), (6) to the overflow drain electrode without discarding the electrons stored in the region corresponding to the gate electrode (4).

Therefore, as in the case of the eighth embodiment, it is possible to change a ratio of the dispensable charges to be discarded relative to the electric charges generated by the photodiode 21 by appropriately controlling a ratio of the charge storing period to the charge discarding period. This means that the sensitivity is adjustable. Other configuration and performance are substantially the same as the sixth or seventh embodiment.

<Tenth Embodiment>

As described above, when using the frame transfer CCD as the image sensor 5, electric charges generated by the photodiode 21 in time periods other than the time periods of extracting the signal charges corresponding to the intensities (A0~A3) of received light may be mixed as the noise components into the signal charges. The noise components are substantially constant, and averaged by storing the electric charges the time periods of extracting the signal charges corresponding to the intensities (A0~A3) of received light. Therefore, it is possible to remove the noise components to some extent and determine the phase difference "ψ".

However, the S/N ratio reduces due to the noise components. For example, when a larger dynamic range is needed at regions for storing or transferring the electric charges, the cost/performance of the distance measuring apparatus deteriorates. In the present embodiment, as shown in FIGS. 26A and 26B, light-shielding films 65 are formed on the region of storing the signal charges and the region not relating to the generation of electric charges of the photodiodes 21.

In FIGS. 26A and 26B, as in the case of the ninth embodiment, six gate electrodes (1) to (6) are formed every photodiode 21. Specifically, the light-shielding film 65 is formed at the regions corresponding to the gate electrodes (1) and (4), so that electric charges (electrons "e") are generated only at the regions corresponding to the gate electrodes (2), (3), (5) and (6) of the respective photodiode 21. As a result, the gate electrode (4) does not substantially contribute the generation of electric charges. In other words, the noise components do not occur at the gate electrode (4). Therefore, as compared with the case of not forming the light-shielding film 65, it is possible to improve the S/N ratio. Alternatively, the light-shielding film 65 may be formed at the regions corresponding to the gate electrodes (1), (3), (4) and (5), so that electric charges (electrons "e") are generated only at the regions corresponding to the gate electrodes (2) and (6) of the photodiode 21. Other configuration and performance are substantially the same as the ninth embodiment.

In the fourth or tenth embodiment, the timing of applying the voltages to the first and second electrodes were controlled by the method explained in the first embodiment. Alternatively, the method explained in the second or third embodiment may be used.

In the above-explained embodiments, the electric charges are output every time that the signal charges corresponding to one intensity (A0, A1, A2, A3) of received light are detected. According to an image sensor 1 explained below, it is possible to simultaneously detect the signal charges corresponding to at least two intensities (A0, A1, A2, A3) of received light.

<Eleventh Embodiment>

Figure 27:
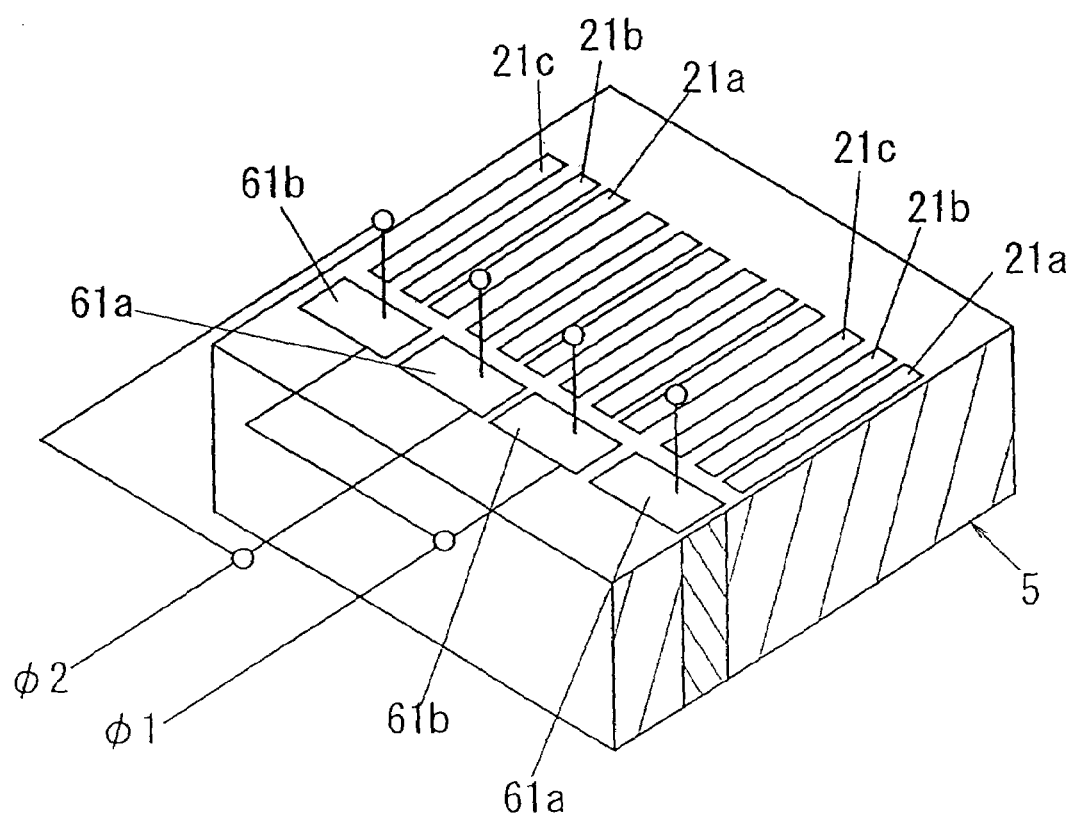
FIG. 27 is a perspective view of a distance measuring apparatus according to an eleventh embodiment of the invention.

In this embodiment, a modification of the frame transfer CCD having the overflow-drain of FIG. 19 is used as the image sensor 1. That is, as shown in FIG. 27, overflow drains (61a, 61b) are alternately disposed such that each of the overflow drains is formed every photodiode 21. Therefore, the electric charges generated by each of the photodiodes 21 can be separately discarded.

A ratio of the signal charges supplied into the potential well of the charge storage portion relative to the electric charges generated by the photodiode 21 can be changed by applying the voltage to each of the overflow drains 61a, 61b in synchronization with the period of the modulation signal. In this embodiment, the timing of applying the voltage to the overflow drain 61a is different by 180 degrees from the timing of applying the voltage to an adjacent overflow drain 61b in a direction of transferring the signal charges. Thus, by applying the two voltages having different phases (φ1, φ2) to the overflow drains 61a, 61b, the signal charges corresponding to these two phases of the modulation signal, which are different from each other by 180 degrees, can be respectively stored in the potential wells formed in the corresponding photodiodes 21.

That is, the signal charges corresponding to two of four intensities (A0~A3) of received light required to determine the phase difference "ψ" can be simultaneously extracted. For example, the signal charges corresponding to the intensities (A0 and A3) of received light are simultaneously extracted, and then the signal charges corresponding to the intensities (A1 and A2) of received light are simultaneously extracted.

In this embodiment, since the signal charges are mixed with extraneous electric charges with an intended purpose, they become noise components. However, amounts of the extraneous electric charges are much smaller than the signal charges, and the extraneous electric charges are mixed at a substantially constant ratio with the signal charges. Therefore, the noise components have a minimal influence on determining the phase difference "ψ". Other configuration and performance are substantially the same as the seventh embodiment.

<Twelfth Embodiment>

Figure 28:
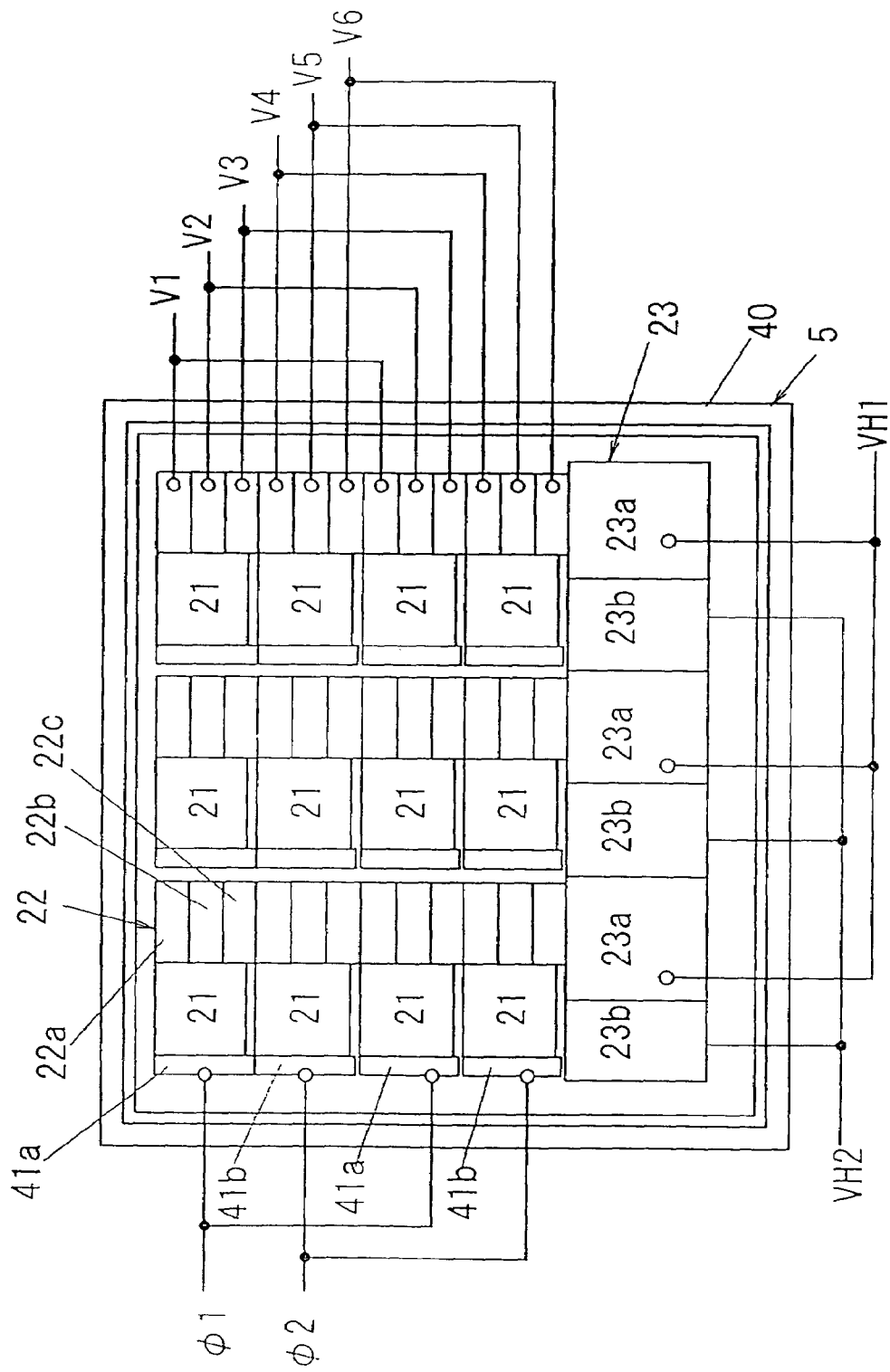
FIG. 28 is a plan view of an image sensor of a distance measuring apparatus according to a twelfth embodiment of the invention.

In this embodiment, a modification of the interline transfer CCD having the lateral overflow-drain is used as the image sensor 5 in place of the modification of the frame transfer CCD. That is, as shown in FIG. 28, overflow drains (41a, 41b) are alternately disposed adjacent to the photodiodes 21 aligned in the vertical direction such that each of the overflow drains is provided every photodiode 21. In the vertical transfer portion 22, three gate electrodes 22a~22c are provided every photodiode 21.

In this image sensor 1, voltages are applied at different phases of the modulation signal to the adjacent overflow drains 41a, 41b in the vertical direction. In addition, as in the case of the eleventh embodiment, the gate electrodes 22a~22c are driven by 6 phase control voltages. As a result, it is possible to simultaneously obtain the signal charges corresponding to two of the four intensities (A0~A3) of received light. Other configuration and performance are substantially the same as the eleventh embodiment.

<Thirteen Embodiment>

In the eleventh and twelfth embodiments, three gate electrodes are provided every overflow drain. However, the number of gate electrodes provided every overflow drain may be four or more. In addition, when voltages are applied to four different overflow drains at four timings, which are different from each other by 90 degrees with respect to the phase of the modulation signal, it is possible to simultaneously obtain the signal charges corresponding to four intensities (A0~A3) of received light. Moreover, the timing of applying each of voltages may be a specific phase synchronized with the period of the modulation signal. An interval between the timings of applying the voltages can be optionally determined.

Figure 29:
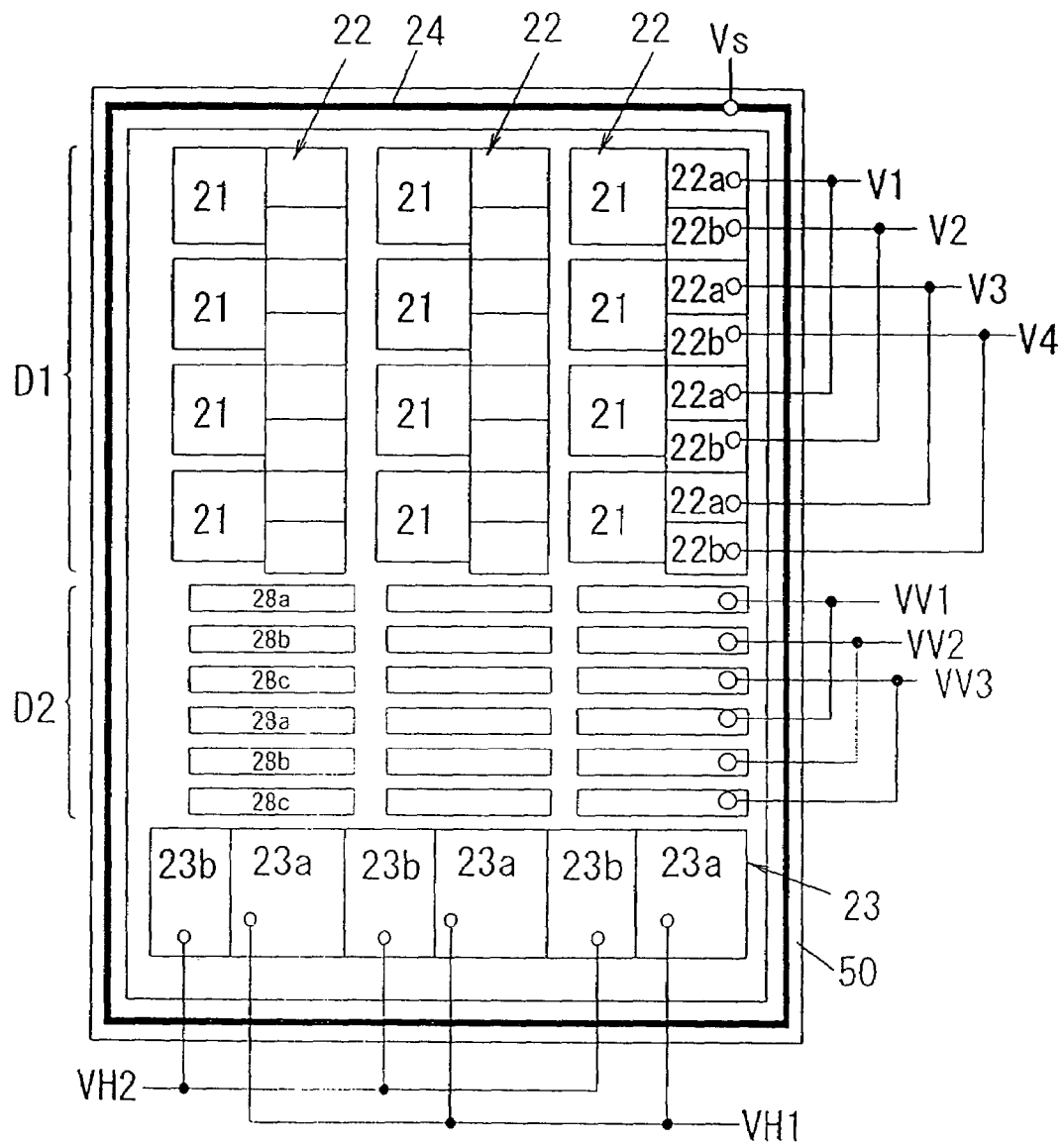
FIG. 29 is a plan view of an image sensor of the distance measuring apparatus according to a thirteenth embodiment of the invention.

In the above embodiments, the interline transfer CCD or the frame transfer CCD were used as the image sensor 1. In addition, a frame interline transfer CCD may be used, which is obtained by replacing the image pickup portion "D1" of the frame transfer CCD of FIG. 14 with photodiodes 21 and vertical transfer portions 22 of the interline transfer CCD, as shown in FIG. 29. In this case, there is an advantage of preventing the occurrence of smear, as compared with the frame transfer CCD.

In the above-explained embodiments, an image sensor having one dimensional array of photodiodes may be used in place of the image sensor 1. In addition, only one photoelectric converter 11 may be used in the first embodiment. The analyzer used in the above embodiments provides the distance information. However, as the information concerning the intended space, only the phase difference "ψ" may be determined. Alternatively, the analyzer may determine another spatial information concerning the intended space according to the intensity of received light.

INDUSTRIAL APPLICABILITY

As described above, according to the spatial information detecting apparatus of the present invention, by controlling the voltage applied to an electrode of the charge discarding portion at the timing synchronized with the period of a modulation signal, it is possible to surely remove residual electric charges, which are dispensable charges not used as signal charges, of the electric charge generated by the photoelectric converter before they are transferred to charge storage portion, and as a result remarkably improve S/N ratio.

In the case of using a spatial information detecting apparatus with a conventional CCD image sensor having an overflow drain electrode, it is possible to adequately control the sensitivity of the CCD image sensor by removing dispensable charges from electric charges generated by photoelectric converters of the CCD image sensor according to a control voltage applied to the overflow electrode in synchronization with the period of the modulation signal, and storing the balance of the electric charges as the signal charges in a charge storage area of the CCD image sensor.

The spatial information detecting apparatus of the present invention is widely available to any devices required to determine a phase difference between the intensity-modulated light and the received light, and particularly suitable to the distance measuring apparatus.

The invention claimed is:

1. A spatial information detecting apparatus using intensity-modulated light comprising:
   at least one photoelectric converter for receiving a light provided from a space, into which a light intensity-modulated by a predetermined modulation signal is being irradiated, and generating amounts of electric charges corresponding to an intensity of received light;
   charge discarding means having a first electrode for removing dispensable charges from the electric charges generated by said photoelectric converter according to a voltage applied to said first electrode;
   charge storage means for storing signal charges from the electric charges generated by said photoelectric converter;
   a control circuit for controlling the voltage applied to said first electrode at a timing synchronized with a period of said modulation signal to change a ratio of the signal charges stored in said charge storage means to the electric charges generated by said photoelectric converter;
   a charge ejector for outputting the signal charges from said charge storage means; and
   an analyzer for determining spatial information from an output of said charge ejector.

2. The spatial information detecting apparatus as set forth in claim 1, wherein said charge storage means has a second electrode, and said control circuit controls a voltage applied to said second electrode constant to transfer required amounts of the electric charges generated by said photoelectric converter to said charge storage means.

3. The spatial information detecting apparatus as set forth in claim 2, wherein said control circuit controls the voltages applied to said first electrode and said second electrode so as to alternately switch between a stage of transferring the electric charges generated by said photoelectric converter to said charge storage means and a stage of transferring the electric charges generated by said photoelectric converter to said charge discarding means.

4. A spatial information detecting apparatus using intensity-modulated light comprising:
- at least one photoelectric converter for receiving a light provided from a space, into which a light intensity-modulated by a predetermined modulation signal is being irradiated, and generating amounts of electric charges corresponding to an intensity of received light;
- charge discarding means having a first electrode for removing dispensable charges from the electric charges generated by said photoelectric converter according to a voltage applied to said first electrode;
- charge storage means having a second electrode for storing signal charges from the electric charges generated by said photoelectric converter according to a voltage applied to said second electrode;
- a control circuit for controlling the voltage applied to said second electrode at a timing synchronized with a period of said modulation signal, while applying a constant voltage to said first electrode, to change a ratio of the signal charges stored in said charge storage means to the electric charges generated by said photoelectric converter;
- a charge ejector for outputting the signal charges from said charge storage means; and
- an analyzer for determining spatial information from an output of said charge ejector.

5. The spatial information detecting apparatus as set forth in claim 1, wherein said at least one photoelectric converter is a plurality of photoelectric converters, and the spatial information detecting apparatus includes a CCD image sensor having said photoelectric converters, said charge storage means and said charge ejector, and wherein said CCD image sensor has an overflow drain as said charge discarding means.

6. The spatial information detecting apparatus as set forth in claim 1, wherein said at least one photoelectric converter is a plurality of photoelectric converters,
- a set of photoelectric converters is selected from said photoelectric converters to define one pixel,
- said control circuit allows said charge storage means to store the signal charges from the electric charges generated by each of said photoelectric converters of the set at a timing of each of different phases in synchronization with the period of said modulation signal, and wherein
- said charge ejector simultaneously outputs the signal charges stored with respect to the different phases.

7. The spatial information detecting apparatus as set forth in claim 2, wherein said charge storage means has a light shielding film on said second electrode formed in the vicinity of a region of storing the signal charges.

8. The spatial information detecting apparatus as set forth in claim 1, wherein said analyzer determines a phase difference between the light irradiated into the space and the light received by said photoelectric converter from the signal charges stored with respect to different phases of said modulation signal.

9. The spatial information detecting apparatus as set forth in claim 8, wherein said analyzer converts said phase difference into distance information.

10. The spatial information detecting apparatus as set forth in claim 1, wherein said analyzer determines distance information from the signal charges stored with respect to different phases in a period of said modulation signal, and wherein the spatial information detecting apparatus further comprises a phase switch for changing the phase of said modulation signal, at which the voltage is applied to said first electrode, every time that storing the signal charges in said charge storage means at the phase is finished.

11. A spatial information detecting method using a CCD image sensor having an overflow drain electrode comprising the steps of:
- allowing said CCD image sensor to receive a light provided from a space, into which a light intensity-modulated by a predetermined modulation signal is being irradiated;
- storing signal charges by repeating a charge extraction operation plural times with respect to each of different phases in a period of said modulation signal; and
- determining spatial information from the signal charges stored with respect to the different phases of said modulation signal,
  - wherein said charge extraction operation includes the steps of removing dispensable charges from electric charges generated by photoelectric converters of said CCD image sensor according to a control voltage applied to said overflow electrode in synchronization with the period of said modulation signal, and storing the balance of the electric charges as the signal charges in a charge storage area of said CCD image sensor.

12. The spatial information detecting method as set forth in claim 11, wherein said CCD image sensor is an interline transfer CCD image sensor.

13. The spatial information detecting method as set forth in claim 11, wherein said CCD image sensor is a frame transfer CCD image sensor.

14. The spatial information detecting method as set forth in claim 13, wherein said CCD image sensor has at least three photoelectric converters, and said charge extraction operation includes the step of applying the control voltage to said overflow drain electrode in synchronization with the period of said modulation signal such that the electric charges generated by a predetermined one(s) of said at least three photoelectric converters are stored as the signal charges in said charge storage area, and the electric charges generated by the remaining photoelectric converter(s) are discarded as the dispensable charges.

15. The spatial information detecting method as set forth in claim 14, wherein the control voltage is applied to said overflow drain electrode to generate a potential barrier for electrically isolating the predetermined photoelectric converter(s) from the remaining photoelectric converter(s).

16. A light receiving element with controllable sensitivity comprising:
- at least one photoelectric converter for receiving a light provided from a space, into which a light intensity-modulated by a predetermined modulation signal is being irradiated, and generating amounts of electric charges corresponding to an intensity of received light;
- charge discarding means having an electrode for removing dispensable charges from the electric charges generated by said photoelectric converter according to a voltage applied to said electrode;

charge storage means for storing signal charges from the electric charges generated by said photoelectric converter;

a sensitivity controller for controlling the voltage applied to said electrode at a timing synchronized with a period of said modulation signal to change a ratio of the signal charges stored in said charge storage means to the electric charges generated by said photoelectric converter; and;

a charge ejector for outputting the signal charges from said charge storage means.

* * * * *